(12) United States Patent
Ishikawa et al.

(10) Patent No.: US 6,412,702 B1
(45) Date of Patent: Jul. 2, 2002

(54) NON-CONTACT IC CARD HAVING AN ANTENNA COIL FORMED BY A PLATING METHOD

(75) Inventors: Yoshihiro Ishikawa; Hironobu Kanesawa, both of Mito (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/490,632

(22) Filed: Jan. 24, 2000

(30) Foreign Application Priority Data

| Jan. 25, 1999 | (JP) | 11-015270 |
| Jan. 25, 1999 | (JP) | 11-015271 |
| Jan. 25, 1999 | (JP) | 11-015272 |
| Jan. 25, 1999 | (JP) | 11-015273 |
| Jan. 25, 1999 | (JP) | 11-015274 |
| Jan. 25, 1999 | (JP) | 11-015276 |
| Mar. 31, 1999 | (JP) | 11-092953 |

(51) Int. Cl.⁷ .................................................. G06K 19/06
(52) U.S. Cl. ................... 235/492; 235/380; 235/488; 235/487
(58) Field of Search .................... 235/492, 380, 235/487, 488

(56) References Cited

U.S. PATENT DOCUMENTS

| 5,337,063 | A | * | 8/1994 | Takahira ..................... 343/741 |
| 5,852,289 | A | * | 12/1998 | Masahiko .................... 235/492 |
| 5,965,867 | A | * | 10/1999 | Haghiri-Tehrani .......... 235/492 |
| 6,049,463 | A | * | 4/2000 | O'Malley et al. ........ 235/380 X |
| 6,095,423 | A | * | 7/2000 | Houdeau et al. ............ 235/487 |
| 6,142,381 | A | * | 11/2000 | Finn et al. .................. 235/492 |
| 6,173,898 | B1 | * | 1/2001 | Mande ........................ 235/488 |
| 6,208,019 | B1 | * | 3/2001 | Tane et al. ............. 235/492 X |

FOREIGN PATENT DOCUMENTS

JP          11134458          * 5/1999

* cited by examiner

Primary Examiner—Karl D. Frech
Assistant Examiner—Allyson Sanders
(74) Attorney, Agent, or Firm—Frishauf, Holtz, Goodman & Chick, P.C.

(57) ABSTRACT

In a non-contact IC card comprising a flexible board having a principal surface and an electronic circuit part mounted on the principal surface of the flexible board, an antenna coil is formed on the principal surface of the flexible board by a plating method. The electronic circuit part includes at least one IC chip. The antenna coil is connected to the electronic circuit part.

12 Claims, 19 Drawing Sheets

NON-CONTACT IC CARD HAVING AN ANTENNA COIL FORMED BY A PLATING METHOD

BACKGROUND OF THE INVENTION

This invention relates to a non-contact IC (integrated circuit) card and, more particularly, to a non-contact IC card comprising a flexible board on which an electronic circuit part including an IC chip and an antenna coil connected to the electronic circuit part are mounted.

Attention is directed to, as an IC card on which an IC chip is mounted, a non-contact IC card which carries out transmission/reception of information between a terminal equipment and the con-contact IC card with non-contact. Inasmuch as the non-contact IC card transmits/receives information to/from the terminal equipment with a non-contact fashion, it is possible to avoid disadvantages such as contamination and damage in terminal portions of the IC chip or the like. Accordingly, there is a great demand for non-contact IC cards.

More specifically, in the non-contact IC card, transmission/reception of information to/from the terminal equipment is carried out using an electromagnetic wave as a medium. That is, the non-contact IC card carries out transmission/reception of information to/from the terminal equipment by superimposing the information on the electromagnetic wave. For this purpose, the non-contact IC card comprises not only the IC chip but also an antenna coil for transmitting and receiving the electromagnetic wave.

In the above-mentioned non-contact IC card, the antenna coil is generally formed on a flexible resinous board by etching. More specifically, a method of forming the antenna coil comprises the steps of preparing the flexible resinous board such as a polyimide film or the like, the flexible resinous board having a principal surface, of forming a copper-clad laminate including copper foil on the principal surface of the flexible resinous board, and of etching the copper foil of the copper-clad laminate into a desired configuration to form the antenna coil.

On forming the antenna coil using the copper-clad laminate, a resist having the desired configuration is formed on the copper foil, the copper foil is etched into the desired configuration by using the resist as a mask, and thereafter the resist is torn from the copper foil using organic solvent or the like. In this event, inasmuch as the resist is torn using the organic solvent, waste liquid of the organic solvent contains copper and circumstances are contaminated. In addition, in this case, inasmuch as the copper-clad laminate is etched, it is disadvantageous in that almost all the copper foil is wasted and a cost of production is increased.

In the above-mentioned non-contact IC card, the antenna coil has an inductance which is determined by a coil configuration and a conductor resistance. In the above-mentioned non-contact IC card, inasmuch as the antenna coil is formed by etching the copper foil in the manner which is described above, the conventional non-contact IC card is disadvantageous in that it is impossible to adjust the inductance of the antenna coil once the antenna coil is formed.

In addition, a conventional non-contact IC card, an insulating layer is formed on the principal surface of the flexible resinous board so as to cover the antenna coil in order to prevent the antenna coil from corroding. Subsequently, through-holes are formed in the insulating layer in order to achieve electrical continuity of end portions of the antenna coils. Thereafter, an electronic circuit part is mounted on the insulating layer so as to electrically connect to the antenna coil. Finally, a decorative laminated tape is laminated to the non-contact IC card so as to cover the insulating layer and the electronic circuit part.

Inasmuch as the electronic circuit part is disposed on the insulating layer in the above-mentioned conventional non-contact IC card, the decorative laminated tape has an uneven principal surface. Accordingly, the conventional non-contact IC card is disadvantageous in that the appearance of the non-contact IC card is ugly, it is difficult to perform print on the uneven principal surface of the decorative laminated tape, and the non-contact IC card is mechanically weak because of occurrence of catching at difference in level or the like.

Inasmuch as terminals of the electronic circuit part are in contact with a metallic plate film in a case of forming the antenna coil by a plating method, a resistance of contact extremely increases in a case where an oxide film is formed on the metallic plate film. Accordingly, the conventional non-contact IC card is disadvantageous in that it is difficult to certainly realize a stable operation.

Furthermore, the terminals of the electronic circuit part are electrically connected to the end portions of the antenna coil using a conductive adhesive, a solder, an anisotropic conductive film, or the like in the conventional non-contact IC card, productivity of the conventional non-contact IC card has poor. In addition, the conventional non-contact IC card is also disadvantageous in that the fabricating cost of the non-contact IC card increases because of use of the conductive adhesive, the solder, the anisotropic conductive film, or the like.

It is desired in the non-contact IC card to improve sensitivity for the electromagnetic wave on which the information is superimposed. However, it is not preferable that the electronic circuit part is improved to increase the sensitivity for the electromagnetic wave because of increase of the cost. In addition, it is difficult to sufficiently increase the sensitivity for the electromagnetic wave although a resistance value of the antenna coil is decreased or the like.

SUMMARY OF THE INVENTION

It is therefore an object of the present invention to provide a non-contact IC card and a method of fabricating thereof, wherein circumstances are not contaminated.

It is another object of the present invention to provide a non-contact IC card and a method of fabricating thereof, which have superior productivity.

It is still another object of the present invention to provide a non-contact IC card and an inductance adjustment method which are capable of adjusting an inductance of an antenna coil after the antenna coil is formed.

It is yet another object of the present invention to provide a non-contact IC card which has a flat principal surface.

It is a further object of the present invention to provide a non-contact IC card of the type described, which is capable of easily printing.

It is a still further object of the present invention to provide a non-contact IC card of the type described, which is mechanically strong.

It is a yet further object of the present invention to provide a non-contact IC card and a method of fabricating thereof, which is capable of easily fabricating the non-contact IC card.

It is another object of the present invention to provide a non-contact IC card and a method of fabricating thereof, which has a superior productivity.

It is still another object of the present invention to provide a non-contact IC card and a method of fabricating thereof, wherein an electronic circuit part is certainly connected to an antenna coil without mounting the electronic circuit part on a metallic plate film.

It is yet another object of the present invention to provide a non-contact IC card and a method of fabricating thereof, which are capable of fabricating the non-contact IC card without using a conductive adhesive, a solder, an anisotropic conductive film, or the like.

It is a further object of the present invention to provide a non-contact IC card and a method of fabricating thereof of the type described, which have a superior productivity.

It is a still further object of the present invention to provide a non-contact IC card and a method of fabricating thereof of the type described, which is capable of achieve cost reduction.

It is a yet further object of the present invention to provide a non-contact IC card which has a superior sensitivity for an electromagnetic wave on which information is superimposed.

Other objects of this invention will become clear as the description proceeds.

According to a first aspect of this invention, a non-contact integrated circuit (IC) card comprises a flexible board having a principal surface. Mounted on the principal surface of the flexible board, an electronic circuit part includes at least one IC chip. Connected to the electronic circuit part, an antenna coil is formed on the principal surface of the flexible board by a plating method.

According to a second aspect of this invention, a non-contact integrated circuit (IC) card comprises a flexible board having first and second principal surfaces which are opposed to each other. First and second electronic circuit parts are mounted on the first and the second principal surfaces of the flexible board, respectively. Each of the first and the second electronic circuit parts includes at least one IC chip. Connected to the first and the second electronic circuit parts, respectively, first and second antenna coils are formed on the first and the second principal surfaces of the flexible board by a plating method, respectively.

According to a third aspect of this invention, a method of fabricating a non-contact integrated circuit (IC) card is provided. This method comprises the steps of preparing a flexible board having a principal surface, of forming an antenna coil on the principal surface of said flexible board by a plating method, of mounting an electronic circuit part on the principal surface of the flexible board, the electronic circuit part including at least one IC chip, and of electrically connecting the antenna coil with the electronic circuit part.

According to a fourth aspect of this invention, a method of fabricating a non-contact integrated circuit (IC) card is provided. This method comprises the steps of preparing a flexible board having first and second principal surfaces, of forming first and second antenna coils on the first and the second principal surfaces of the flexible board by a plating method, of mounting first and second electronic circuit parts on the first and the second principal surfaces of the flexible board, each of the first and the second electronic circuit parts including at least one IC chip, and of electrically connecting the first and the second antenna coils with the first and the second electronic circuit parts, respectively.

According to a fifth aspect of this invention, a non-contact integrated circuit (IC) card comprises a flexible board having a principal surface. Mounted on the principal surface of the flexible board, an electronic circuit part includes at least one IC chip. Connected to the electronic circuit part, an antenna coil is formed on the principal surface of the flexible board. The antenna coil comprises an inductance adjustment circuit part.

According to a seventh aspect of this invention, a method is for adjusting inductance in an antenna coil formed on a principal surface of a flexible board for use in a non-contact integrated circuit (IC) card which comprises an electronic circuit part electrically connected to the antenna coil. The electronic circuit part includes an IC chip. This method comprises the steps of forming an inductance adjustment circuit part on the principal surface of the flexible board at the inside of at least one corner of the antenna coil, the inductance adjustment circuit part comprising a plurality of wires which have different lengths, and of disconnecting the wires except for one of the wires with the one of the wires being conducted.

According to an eighth aspect of this invention, a non-contact integrated circuit (IC) card comprises a flexible board having a principal surface. Mounted on the principal surface of the flexible board, an electronic circuit part includes at least one IC chip. Electrically connected to the electronic circuit part, an antenna coil is formed on the principal surface of the flexible board. An insulating layer is deposited on the principal surface of the flexible board at an area excepting the electronic circuit part so as to cover the antenna coil.

According to a ninth aspect of this invention, a non-contact integrated circuit (IC) card comprises a flexible board having a principal surface. An antenna coil is formed on the principal surface of the flexible board. Electrically connected to the antenna coil, an electronic circuit part is mounted on the principal surface of the flexible board. The electronic circuit part includes at least one IC chip. The electronic circuit part is disposed so as to stride over the antenna coil as a predetermined area.

According to a tenth aspect of this invention, a method of fabricating a non-contact integrated circuit (IC) card is provide. This method comprises the steps of preparing a flexible board having a principal surface, of forming an antenna coil on the principal surface of the flexible board, the antenna coil having an outer end portion and an inner end portion, of mounting an electronic circuit part on the principal surface of the flexible board so as to stride over the antenna coil at a predetermined are, the electronic circuit part including at least one IC chip, the electronic circuit part having first and second terminals, and of directly electrically connecting the first and the second terminals of the electronic circuit part with the outer and the inner end portions of the antenna coil, respectively.

According to an eleventh aspect of this invention, a non-contact integrated circuit (IC) card comprises a flexible board having a principal surface. Formed on the principal surface of the flexible board, an antenna coil comprises a conductive ground coat pattern formed on the principal surface of the flexible board in a coil shape and a plate film formed on the conductive ground coat pattern by a plating method at an area excepting both end parts of the ground coat pattern. Mounted on the principal surface of the flexible board, an electronic circuit part includes at least one IC chip. The electronic circuit part has first and second terminals which are attached on the both end parts of the conductive ground coat pattern through conductive adhesive.

According to a twelfth aspect of this invention, a method of fabricating a non-contact integrated circuit (IC) card is provide. This method comprises the steps of preparing a flexible board having a principal surface, of forming a conductive ground coat pattern on the principal surface of the flexible board in a coil shape, the conductive ground coat pattern having both end parts, of disposing a pair of plating electric terminals on the both end parts of the conductive ground coat pattern, of performing plate by supplying the conductive ground coat pattern with a predetermined current using the pair of plating electric terminals to form a plate film so as to cover the conductive ground coat pattern, of removing the pair of plating electric terminals from the conductive ground coat pattern, of mounting an electronic circuit part having first and second terminals on the principal surface of the flexible board so that so that the first and the second terminals of the electronic circuit part are put on the both end parts of the conductive ground coat pattern, and of electrically connecting the first and the second terminals of the electronic circuit part with the both end parts of the conductive ground coat pattern through conductive adhesives.

According to a thirteenth aspect of this invention, a non-contact integrated circuit (IC) card comprises a flexible board having a principal surface. Formed on the principal surface of the flexible board, an antenna coil comprises a conductive ground coat pattern formed on the principal surface of the flexible board in a coil shape and a metallic plate film formed on the conductive ground coat pattern by a plating method. Mounted on the principal surface of the flexible board, an electronic circuit part includes at least one IC chip. The electronic circuit part has first and second terminals which are put on both end parts of the conductive ground coat pattern. The first and the second terminals of the electronic circuit part are covered with the metallic plate film.

According to a fourteenth aspect of this invention, a method of fabricating a non-contact integrated circuit (IC) card is provided. This method comprises the steps of preparing a flexible board having a principal surface, of forming a conductive ground coat pattern on the principal surface of the flexible board in a coil shape, the conductive ground coat pattern having both end parts, of mounting an electronic circuit part having first and second terminals on the principal surface of the flexible board so that the first and the second terminals of the electronic circuit part are in contact with the both end parts of said conductive ground coat pattern, and of performing plate using the conductive ground coat pattern to form a metallic plate film so as to cover the conductive ground coat pattern and the first and the second terminals of the electronic circuit part.

According to a fifteenth aspect of this invention, a non-contact integrated circuit (IC) card comprises a flexible board having a principal surface. An antenna coil is formed on the principal surface of the flexible board. Electrically connected to the antenna coil, an electronic circuit part is mounted on the principal surface of the flexible board. The electronic circuit part includes at least one IC chip. The flexible board has an opening section in a region enclosed with the antenna coil.

According to a sixteenth aspect of this invention, a non-contact integrated circuit (IC) card comprises a flexible board having a principal surface. An antenna coil is formed on the principal surface of the flexible board. Electrically connected to the antenna coil, an electronic circuit part is mounted on the principal surface of the flexible board. The electronic circuit part includes at least one IC chip. A magnetic material is disposed in a region enclosed with the antenna coil.

DESCRIPTION OF THE PREFERRED EMBODIMENT

Figure 1:
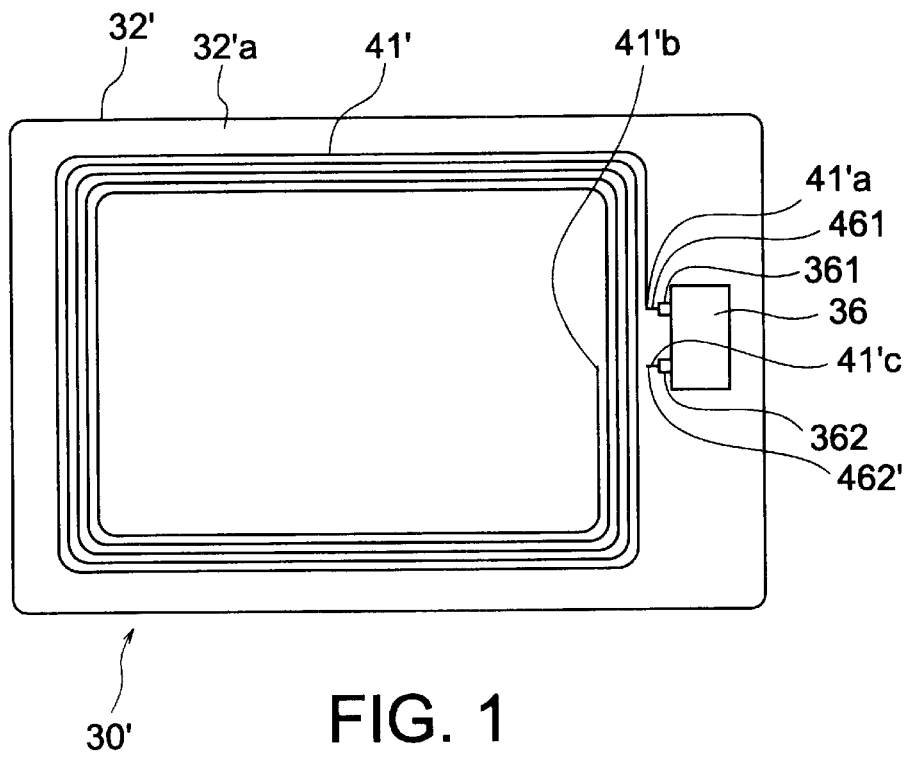
FIG. 1 is a plan view of a conventional non-contact IC card.
Figure 2:
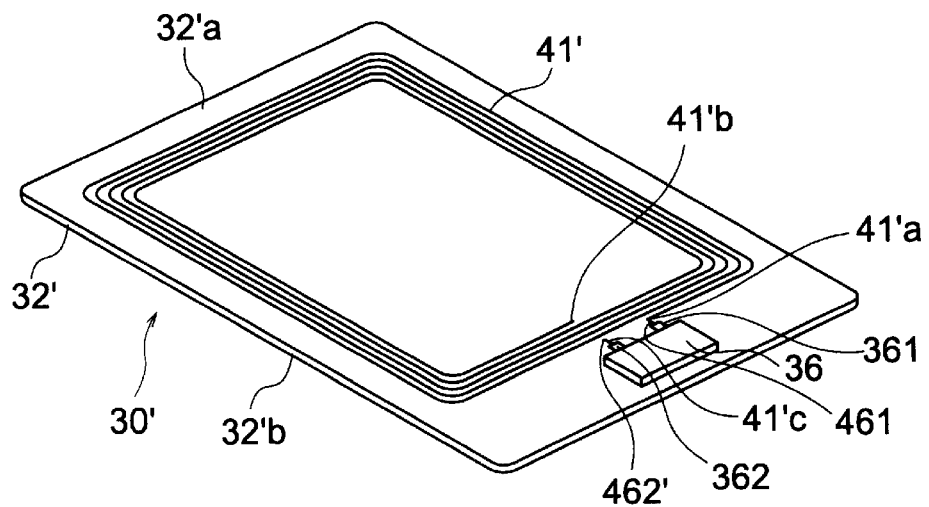
FIG. 2 is a perspective view of the non-contact IC card illustrated in FIG. 1.

Referring to FIGS. 1 and 2, a conventional non-contact IC card 30' will be described at first in order to facilitate an understanding of the present invention. The illustrated non-contact IC card 30' comprises a flexible resinous board 32' having first and second principal surfaces 32'a and 32'b. The flexible resinous board 32' is made of a polyimide film or the like. The non-contact IC card 30' comprises an electronic circuit part 36 which is mounted on the first principal surface 32'a of the flexible resinous board 32'. The electronic circuit part 36 includes at least one IC chip (not shown). The electronic circuit part 36 has first and second terminals 361 and 362.

The non-contact IC card 30' further comprises an antenna coil 41' which is connected to the electronic circuit part 36 in the manner which will later become clear. The antenna coil 41' is formed on the first principal surface 32'a of the flexible resinous board 32' by an etching method in the manner which will later become clear.

The antenna coil 41' has an outer end portion 41'a and an inner end portion 41'b. The outer end portion 41'a is connected to the first terminal 361 of the electronic circuit part 36 through a first lead wire 461. The inner end portion 41'b is connected to an extended end portion 41'c through a second lead wire 462' in the manner which will later become clear. The extended end portion 41'c is connected to the second terminal 362 of the electronic circuit part 36.

In the non-contact IC card 30', the electronic circuit part 36 is mounted on an area of the first principal surface 32'a of the flexible resinous board 32' where the antenna coil 41' is not formed, as illustrated in FIGS. 1 and 2.

The antenna coil 41' is fabricated by the etching method which comprises the steps of forming a copper-clad laminate including copper foil on the first principal surface 32'a of the flexible resinous board 32' and of etching the copper foil of the copper-clad laminate into a desired configuration to form the antenna coil 41'. More specifically, on forming a coil pattern on the principal surface 32'a of the flexible resinous board 32', a resist mask corresponding to the coil pattern is formed on the copper foil, the copper foil exposed from the resist mask is wet etched, and thereafter the resist mask is torn from the copper foil using organic solvent.

Referring now to FIGS. 3A through 3G, description will proceed to a conventional fabrication process of the conventional non-contact IC card 30'.

Figure 3A:
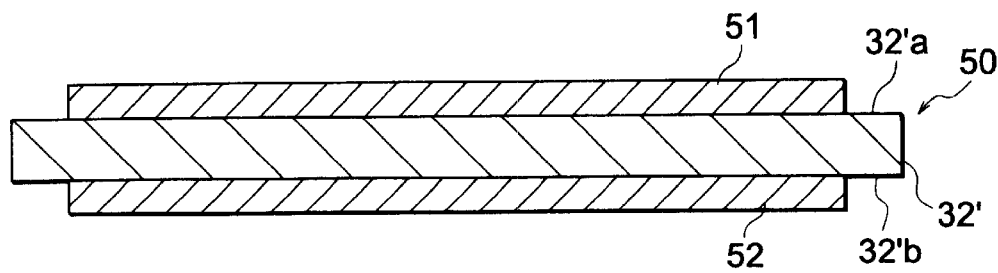
FIGS. 3A through 3G illustrate a conventional fabrication process of the non-contact IC card illustrated in FIGS. 1 and 2.

As shown in FIG. 3A, a copper-clad laminate 50 is prepared in a known manner. The copper-clad laminate 50 comprises the flexible resinous board 32' having the first and the second principal surfaces 32'a and 32'b which are directed an upward and a downward of FIG. 3A and first and second conductive layers 51 and 52 of copper foil formed on the first and the second principal surfaces 32'a and 32'b of the flexible resinous board 32', respectively.

Figure 3B:
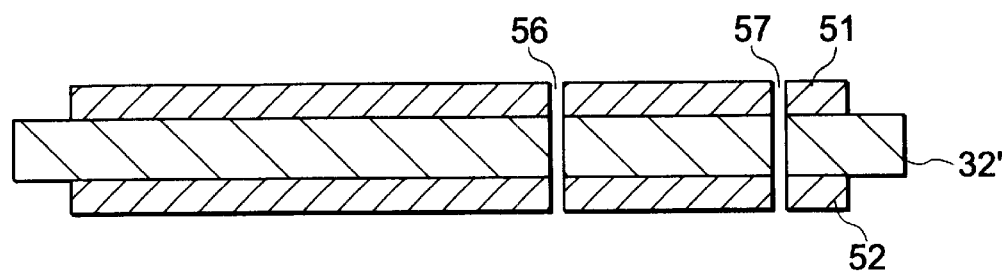

Turning to FIG. 3B, first and second through-holes 56 and 57 are bored in the copper-clad laminate 50.

Figure 3C:
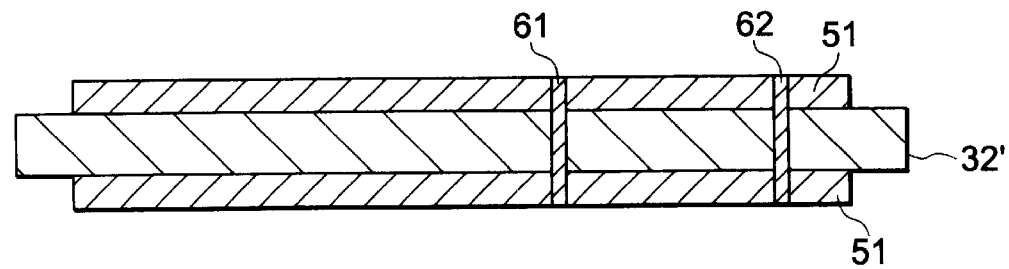

Turning to FIG. 3C, first and second metallic layers 61 and 62 are deposited in the first and the second through-holes 56 and 57 by plating.

Figure 3D:
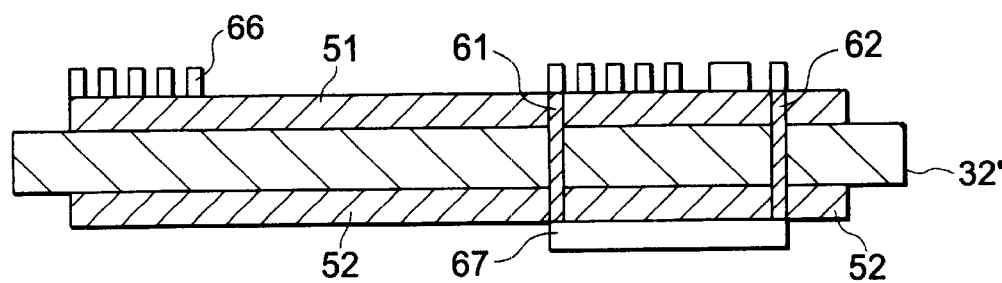

Turning to FIG. 3D, first and second resist patterns 66 and 67 are applied to the first and the second conductive layers 51 and 52, respectively. The first resist pattern 66 has a scroll configuration which is identical with the antenna coil 41' to be formed on the first principal surface 32'a of the flexible resinous board 32'. The second resist pattern 67 has an end at a position corresponding to the first metallic layer 61 and another end at another position corresponding to the second metallic layer 62.

Figure 3E:
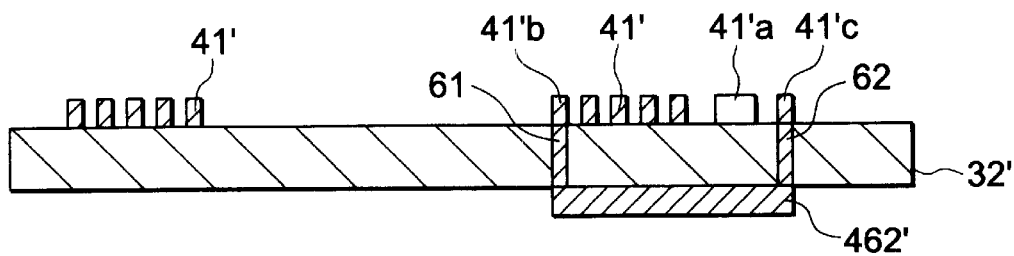

Turning to FIG. 3E, the first and the second conductive layers 51 and 52 are wet etched by using the first and the second resist patterns 66 and 67 as masks before removal of the first and the second resist patterns 66 and 67. As a result, the antenna coil 41' is formed on the first principal surface 32a of the flexible resinous board 32' and the second lead wire 462' is formed on the second principal surface 32b of the flexible resinous board 32. The antenna coil 41' has the outer end portion 41'a and the inner end portion 41'b. The inner end portion 41'b of the antenna coil 41' is connected to the extended end portion 41'c through the first metallic layer 61, the second lead wire 462', and the second metallic layer 62.

Figure 3F:
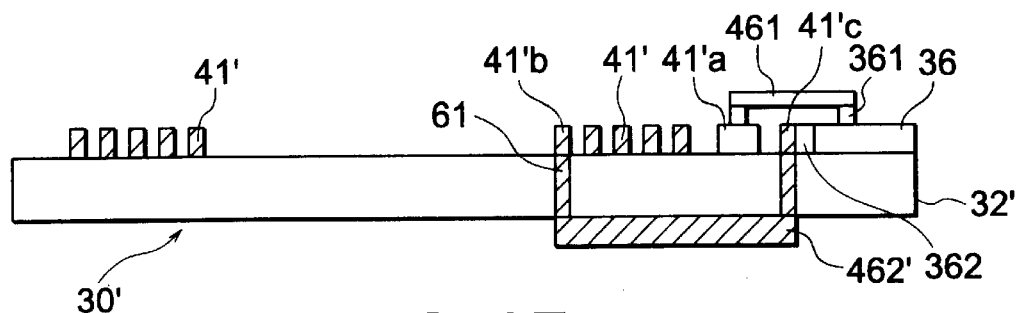

Turning to FIG. 3F, the electronic circuit part 36 is mounted on the first principle surface 32'a of the flexible resinous board 32'. The electronic circuit part 36 has the first and the second terminals 361 and 362. The first terminal 361 of the electronic circuit part 36 is electrically connected to the outer end portion 41'a of the antenna coil 41' through the first lead wire 461. The second terminal 362 of the electronic circuit part 36 is electrically connected to the extended end portion 41'c. As a result, the non-contact IC card 30' is fabricated.

Figure 3G:
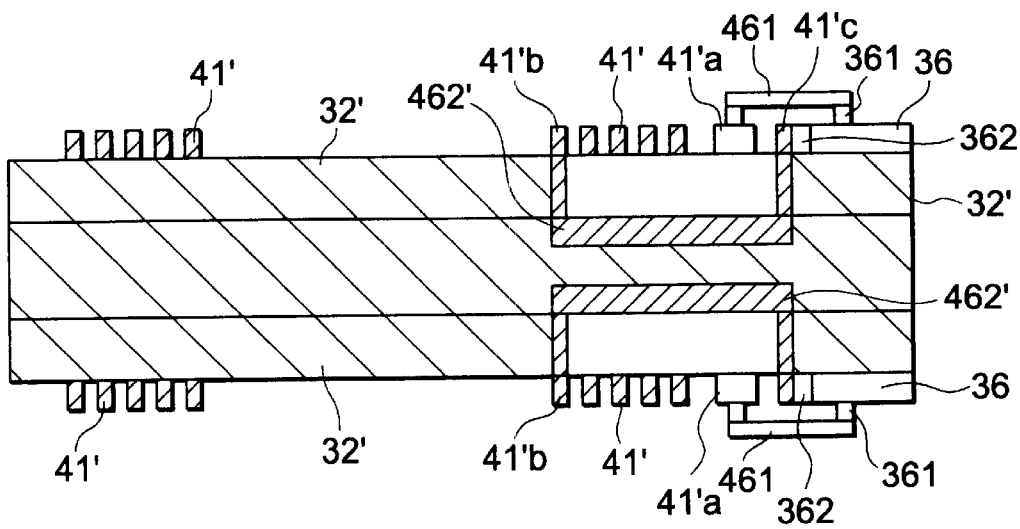

Turning to FIG. 3G, two non-contact IC cards 30' illustrated in FIG. 3F are pasted to each other at the second principal surface 32'b of the flexible resinous board 32'.

In the above-mentioned conventional fabrication process, copper is contained in waste liquid on wet-etching the copper foil and it is necessary to use a lot of injurious organic solvent. Accordingly, in the conventional fabrication process, circumstances are contaminated and it is disadvantageous in that it is necessary to device a countermove so as to make an effect on the circumstances as little as possible. In addition, inasmuch as the copper-clad laminate 50 is etched, it is also disadvantageous in that almost all the copper foil is wasted and a cost of production is increased.

Figure 4:
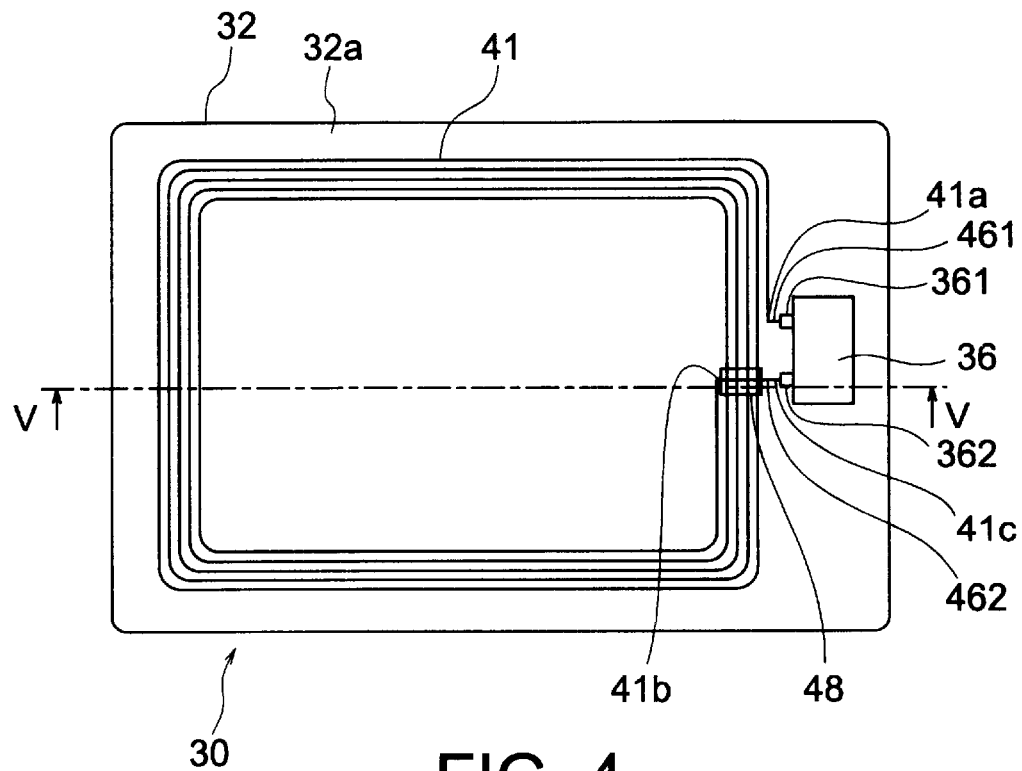
FIG. 4 is a plan view of a non-contact IC card according to a first embodiment of the present invention.
Figure 5:
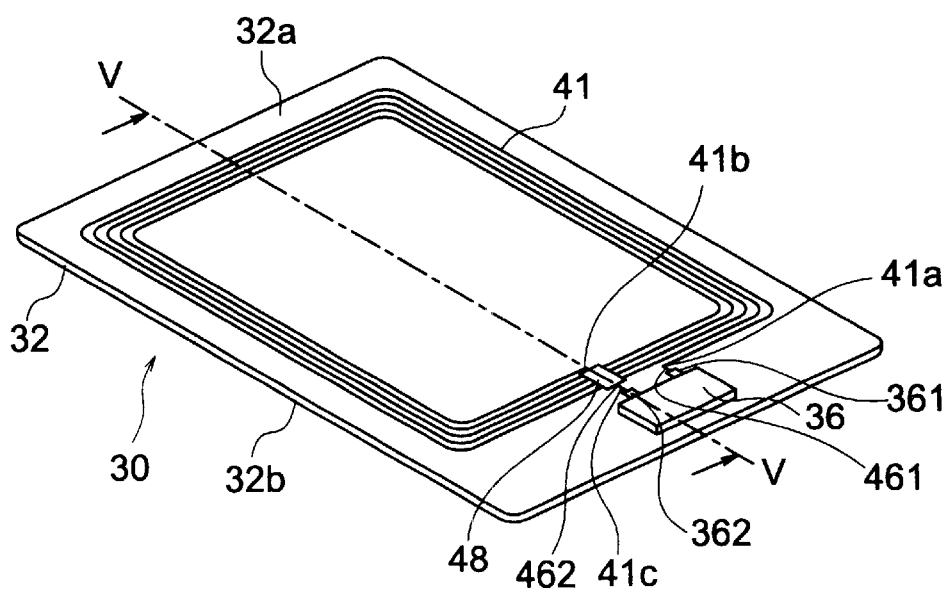
FIG. 5 is a perspective view of the non-contact IC card illustrated in FIG. 4.
Figure 6:
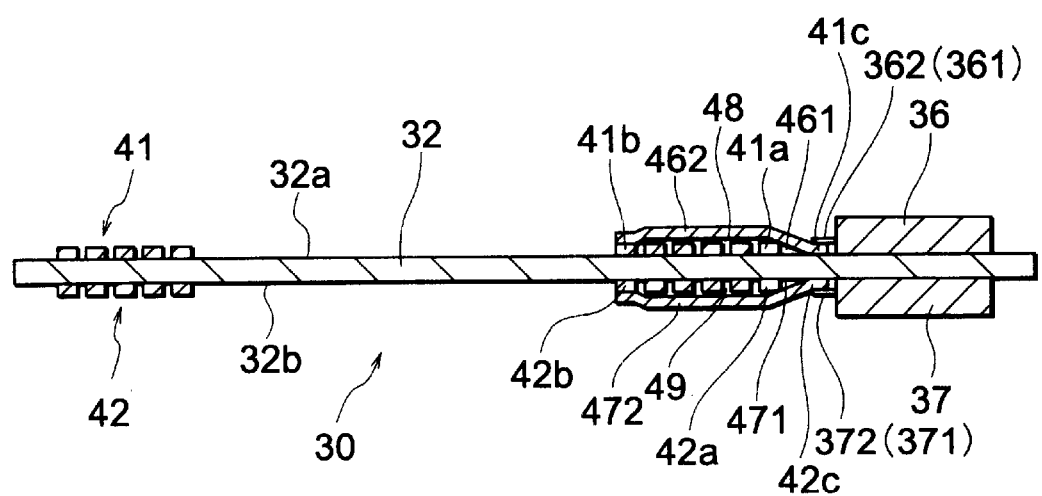
FIG. 6 is a sectional view taken substantially along on the line V—V of FIGS. 4 and 5.

Referring to FIGS. 4, 5, and 6, description will proceed to a non-contact IC card 30 according to a first embodiment of the present invention. FIG. 4 is a plan view of the non-contact IC card 30. FIG. 5 is a perspective view of the non-contact IC card 30. FIG. 6 is a sectional view taken substantially along on the line V—V of FIGS. 4 and 5.

The illustrated non-contact IC card 30 comprises a base material or a flexible board 32 having first and second principal surfaces 32a and 32b which are opposed to each other with the flexible board 32 put between the first and the second principal surface 32a and 32b, as illustrated in FIG. 6. The flexible board 32 has substantially a rectangular shape as illustrated in FIG. 4. In the example being illustrated, the flexible board 32 is made of a polyimide film. The flexible resinous board 32 may be made of a polyester film, a polyetherimide film, a polyetheretheketon film, a polysulfone film, a polyphenylenesulfide film, or the like.

The non-contact IC card 30 comprises first and second electronic circuit parts 36 and 37 which are mounted on the first and the second principal surfaces 32a and 32b of the flexible board 32 as illustrated in FIG. 6. The first and the second electronic circuit parts 36 and 37 include first and second IC chips (not shown), respectively. The first electronic circuit part 36 has a first primary terminal 361 and a second primary terminal 362. The second electronic circuit part 37 has a first subsidiary terminal 371 and a second subsidiary terminal 372.

The non-contact IC card 30 further comprises first and second antenna coils 41 and 42 which are connected to the first and the second electronic circuit parts 36 and 37, respectively, in the manner which will later become clear. The first and the second antenna coils 41 and 41 are formed on the first and the second principal surfaces 32a and 32b of the flexible board 32, respectively, by a plating method in the manner which will later become clear.

The first antenna coil 41 has a first outer end portion 41a and a first inner end portion 41b. The first outer end portion 41a of the first antenna coil 41 is connected to the first primary terminal 361 of the first electronic part 36 through a first primary lead wire 461. The first inner end portion 41b of the first antenna coil 41 is connected to a first extended end portion 41c through a second primary lead wire 462 in the manner which will later become clear. The first extended end portion 41 c is connected to the second primary terminal 362 of the first electronic circuit part 36.

Similarly, the second antenna coil 42 has a second outer end portion 42a and a second inner end portion 42b. The second outer end portion 42a of the second antenna coil 42 is connected to the first subsidiary terminal 371 of the second electronic part 37 through a first subsidiary lead wire 471. The second inner end portion 42b of the second antenna coil 42 is connected to a second extended end portion 42c through a second subsidiary lead wire 472 in the manner which will later become clear. The second extended end portion 42c is connected to the second subsidiary terminal 372 of the second electronic circuit part 37.

In order to prevent electrical short between the second primary lead wire 462 and the first antenna coil 41, a primary insulating film 48 is disposed on the first antenna coil 41 at a position between the first inner end portion 41b and the first extended end portion 41c. In order to prevent electrical short between the second subsidiary lead wire 472 and the second antenna coil 42, a subsidiary insulating film 49 is disposed on the second antenna coil 42 at a position between the second inner end portion 42b and the second extended end portion 42c.

In the manner which is described above, in the non-contact IC card 30, the first and the second antenna coils 41 and 42 are formed by the plating method. The plating method preferably may be electro plating or electroless plating.

Referring now to FIGS. 7A through 7G, the description will proceed to a fabrication process of the non-contact IC card 30.

Figure 7A:
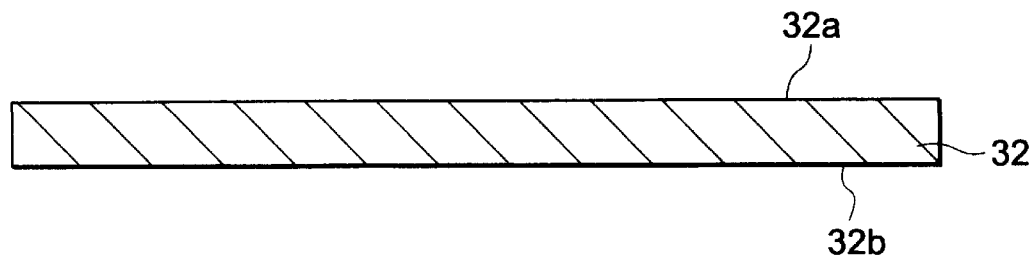
FIGS. 7A through 7G illustrate a fabrication process of the non-contact IC card illustrated in FIGS. 4 through 6.

As shown in FIG. 7A, the flexible board or the base material 32 is prepared in a known manner and has the first and the second principal surfaces 32a and 32b which are directed an upward and a downward of FIG. 7A, respectively.

Figure 7B:
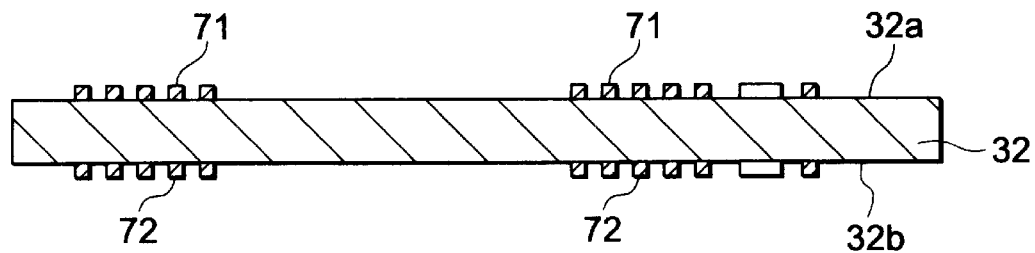

Turning to FIG. 7B, first and second coil patterns 71 and 72 are formed on the first and the second principal surfaces 32a and 32b of the flexible board 32, respectively. The first and the second coil patterns 71 and 72 have substantially similar shape of the first and the second antenna coils 41 and 42 to be formed, respectively. Each of the first and the second coil patterns 71 and 72 is made of conductive paste. Each of the first and the second coil patterns 71 and 72 serves as a substrate or a conductive ground coat pattern. In this event, the first coil pattern 71 is formed so as to correspond to a range between the first outer end portion 41 a of the first antenna coil 41 and the first inner end portion 41b of the first antenna coil 41. The second coil pattern 72 is formed so as to correspond to a range between the second outer end portion 42a of the second antenna coil 42 and the second inner end portion 42b of the second antenna coil 42.

Figure 7C:
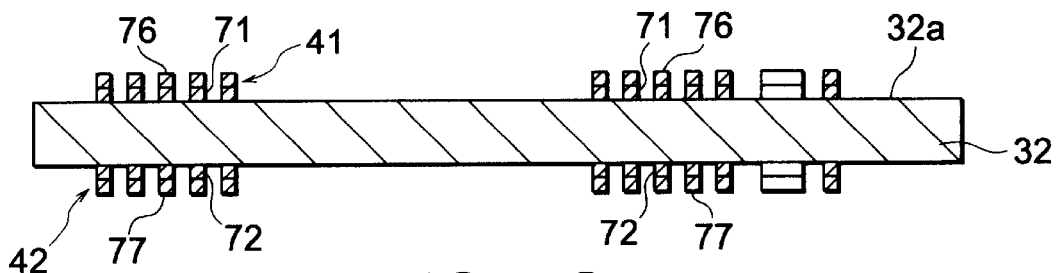

Turning to FIG. 7C, by applying an electric current to the first and the second coil patterns 71 and 72 in plating liquid, first and second copper films 76 and 77 having a predetermined thickness are formed on the first and the second coil patterns 71 and 72, respectively. Each of the first and the second copper films 76 and 77 acts as a metallic plate film. As a result, the first antenna coil 41 is formed at a range corresponding to the range between the first outer end portion 41a of the first antenna coil 41 and the first inner end portion 41b of the first antenna coil 41 while the second antenna coil 42 is formed at a range corresponding to the range between the second outer end portion 42a of the second antenna coil 42 and the second inner end portion 42b of the second antenna coil 42.

Figure 7D:
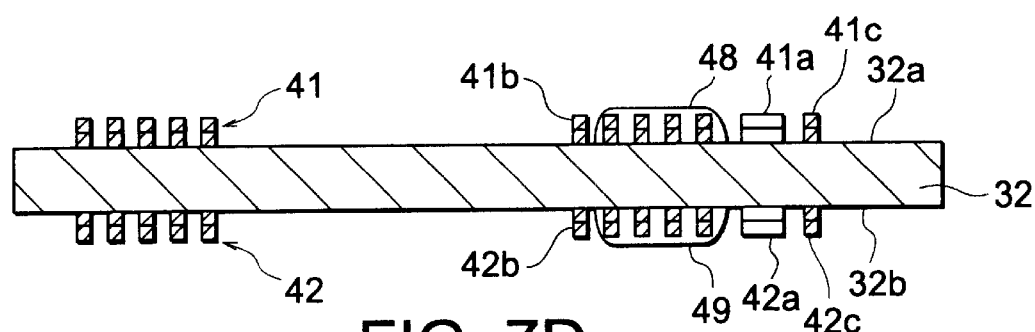

Turning to FIG. 7D, the first antenna coil 41 is covered with the primary insulating film 48 at a range between the first inner end portion 41b and the first extended end portion 41c while the second antenna coil 42 is covered with the subsidiary insulating film 49 at a range between the second inner end portion 42b and the second extended end portion 42c. In this event, each of the primary and the subsidiary films 48 and 49 is obtained by cutting an insulating sheet (not shown) in a predetermined shape and the primary and the subsidiary films 48 and 49 are applied to the first and the second antenna coils 41 and 42 with an adhesive or the like. Alternatively, the primary and the subsidiary insulating films 48 and 49 may be formed by printing.

Figure 7E:
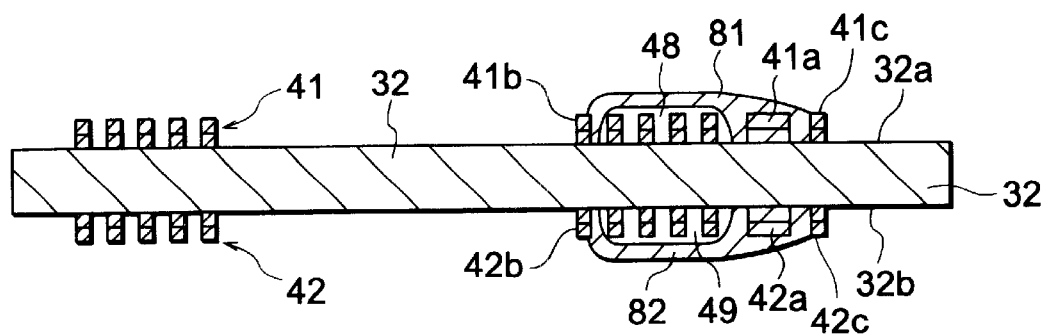

Turning to FIG. 7E, a primary conductive paste 81 is formed on the primary insulating film 48 at a region where the first inner end portion 41b of the first antenna coil 41 and the first extended end portion 41c are linearly linked together and a subsidiary conductive paste 82 is formed on the subsidiary insulating film 49 at a region where the second inner end portion 42b of the second antenna coil 42 and the second extended end portion 42c are linearly linked. Each of the primary and the subsidiary conductive pastes 81 and 82 serves as a jumper.

Figure 7F:
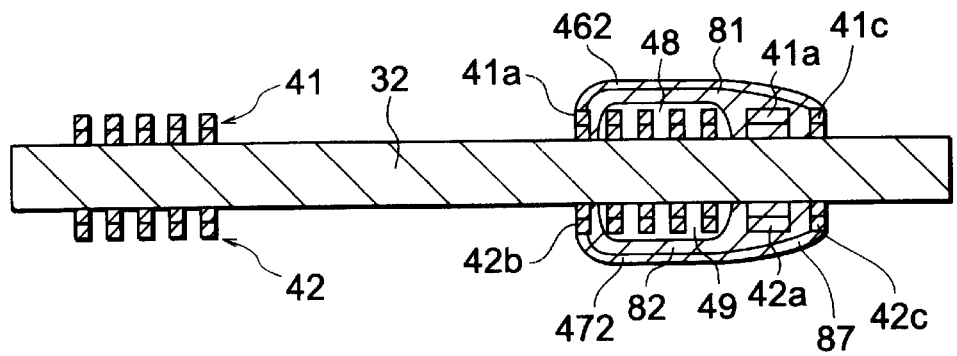

Turning to FIG. 7F, a primary conductive film 86 is deposited on the primary conductive paste 81 by a plating method to form the second primary lead wire 462. Likewise, a subsidiary conductive film 87 is deposited on the subsidiary conductive paste 82 by a plating method to form the second subsidiary lead wire 472.

Alternatively, the second primary lead wire 462 may be formed by forming a primary metal film having low resistance on the primary insulating film 48 at the region where the first inner end portion 41b of the first antenna coil 41 and the first extended end portion 41c are linearly linked together. In addition, the subsidiary lead wire 472 may be formed by forming a subsidiary metal film having low resistance on the subsidiary insulating film 49 at the region where the second inner end portion 42b of the second antenna coil 42 and the second extended end portion 42c are linearly linked.

Figure 7G:
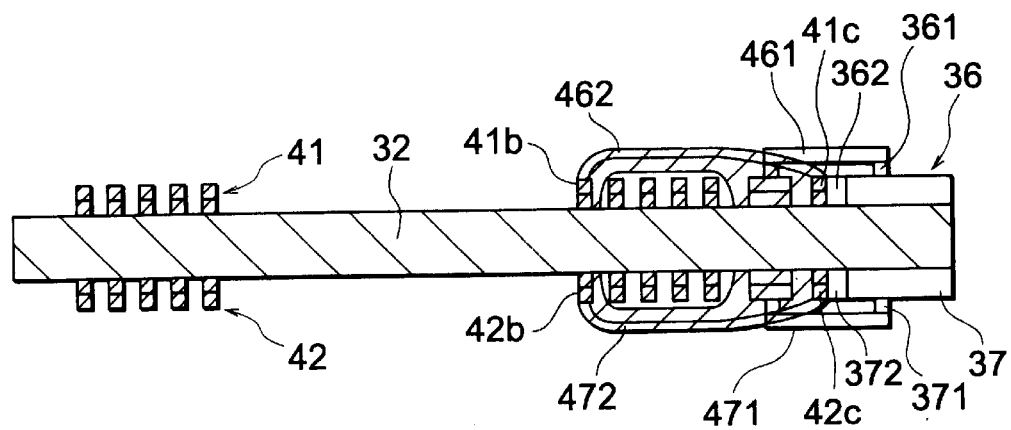

Turning to FIG. 7G, the first and second electronic circuit parts 36 and 37 are mounted on the first and the second principal surfaces 32a and 32b the flexible board 32, respectively. The first and the second electronic circuit parts 36 and 37 include first and second IC chips (not shown), respectively. The first electronic circuit part 36 has the first primary terminal 361 and the second primary terminal 362. The second electronic circuit part 37 has the first subsidiary terminal 371 and the second subsidiary terminal 372. The first outer end portion 41a of the first antenna coil 41 is electrically connected to the first primary terminal 361 of the first electronic circuit part 36 through the first primary lead wire 461 while the second outer end portion 42a of the second antenna 41 is electrically connected to the first subsidiary terminal 371 of the second electronic circuit part 37 through the first subsidiary lead wire 471. The first extended end portion 41c is electrically connected to the second primary terminal 362 of the first electronic circuit part 36 while the second extended end portion 42c is electrically connected to the second subsidiary terminal 372 of the second electronic circuit part 37.

On the other hand, in the non-contact IC card 30, the flexible board 32 is, for example, formed by cutting a film made of a polyimide resin or a polyethylene terephthalate resin in a predetermined shape. In addition, the flexible board 32 is restricted to such structure, the flexible board 32 may have laminated structure or may be made of materials such as paper.

In addition, in the non-contact IC card 30, each of the first and the second electronic circuit parts 36 and 37 includes, for example, the IC chip, a capacitor, or the like therein to form a predetermined electronic circuit. The IC chip may comprise an LSI (large-scale integrated circuit) memory or may comprise a microprocessor or a CPU (central processing unit) and an IC (integrated circuit) memory. In addition, each of the first and the second electronic circuit parts 36 and 37 transmits/receives information to/from a terminal equipment (not shown) which is installed in the exterior.

Under the circumstances, the non-contact IC card 30 uses electromagnetic waves as a medium carrying out transmission and reception of the information and transmission and reception of the electromagnetic waves are carried out via the above-mentioned first and second antenna coils 41 and 42.

Inasmuch as the non-contact IC card 30 comprises the first and the second antenna coils 41 and 42 formed on the first and the second principal surfaces 32a and 32b of the flexible board 32 and the first and the second electronic circuit parts 36 and 37 mounted on the first and the second principal surfaces 32a and 32b of the flexible board 32, the non-contact IC card 30 has a drastically increased storage capacity for the information. In this event, the first and the second electronic circuit parts 36 and 37 may store the same elements of information or may store different elements of information.

Although the first and the second antenna coils 41 and 42 have the same structure and the same resonance frequency, the first and the second antenna coils 41 and 42 may have different structure and different resonance frequencies for various purposes. For example, the first antenna coil 41 may have a first resonance frequency of 4.9 MHz for a cash card for a bank while the second antenna coil 42 may have a second resonance frequency of 13.56 MHz for a commutation ticket. In other words, the first and the second antenna coils 41 and 42 may be symmetrical with each other or may be unsymmetrical with each other. In addition, the first and the second electronic circuit parts 36 and 37 may be used for different purposes. For example, the first electronic circuit part 36 may be used for a commutation ticket while the second electronic circuit part 37 may be used for a credit card.

It is noted that the first and the second electronic circuit parts 36 and 37 are electrically isolated with each other via the flexible board 32. Furthermore, in order to protect the first and the second electronic circuit parts 36 and 37 and the first and the second antenna coils 41 and 42 and for the purpose of external beauty, decorative laminated sheets may be put on the non-contact IC card 30 so as to cover the first and the second electronic circuit parts 36 and 37 and the first and the second antenna coils 41 and 42 and print may be carried out on the decorative laminated sheets.

Figure 8:
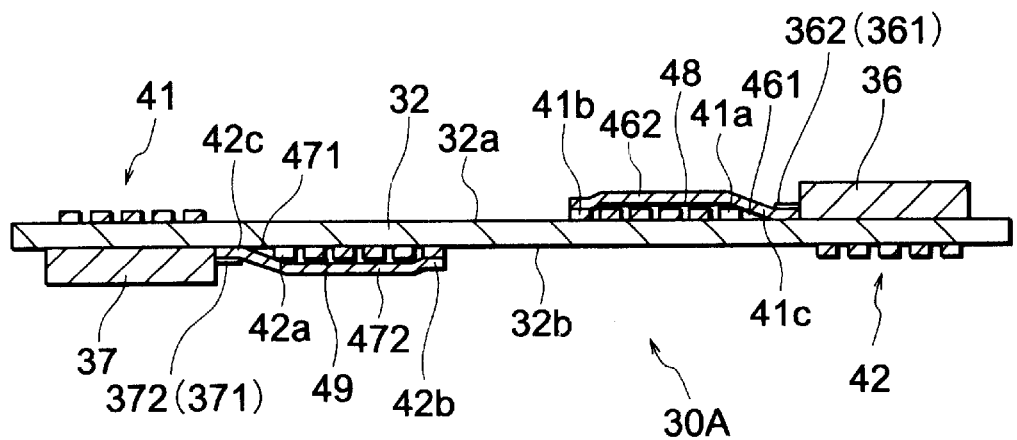
FIG. 8 is a sectional view of a non-contact IC card according to a second embodiment of the present invention.

Referring to FIG. 8, description will proceed to a non-contact IC card 30A according to a second embodiment of the present invention. The illustrated non-contact IC card 30A is similar in structure and operation to the non-contact IC card 30 illustrated in FIG. 6 except that the second electronic circuit part 37 and the second antenna coil 42 are formed on the second principal surface 32b of the flexible board 32 in the opposite direction to the first electronic circuit part 36 and the first antenna coil 41 formed on the first principal surface 32a of the flexible board 32.

With this structure, it is possible to use a combination of the first electronic circuit part 36 and the first antenna coil 41 and a combination of the second electronic circuit part 37 and the second antenna coil 42 for different purposes. For example, the combination of the first electronic circuit part 36 and the first antenna coil 41 may use for a cash card for a bank while the combination of the second electronic circuit part 37 and the second antenna coil 42 may use for a commutation ticket.

Figure 9:
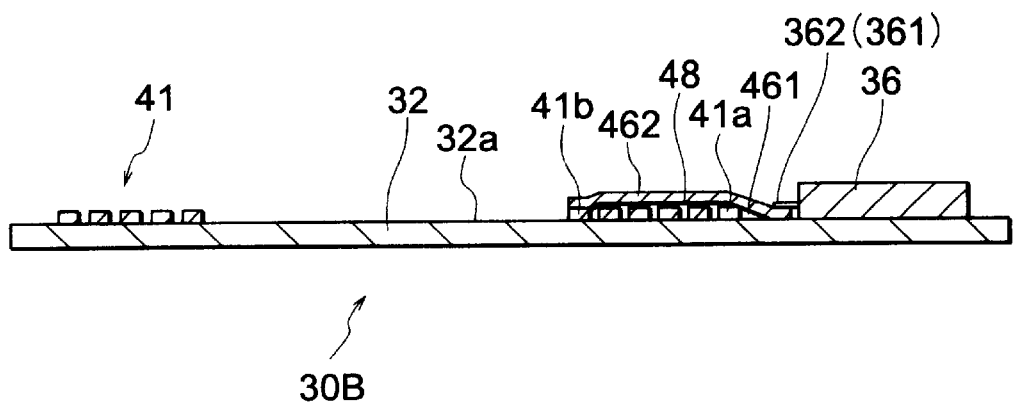
FIG. 9 is a sectional view of a non-contact IC card according to a third embodiment the present invention.

Referring to FIG. 9, description will proceed to a non-contact IC card 30B according to a third embodiment of the present invention. The illustrated non-contact IC card 30B is similar in structure and operation to the non-contact IC card 30 illustrated in FIG. 6 except that the second electronic circuit part 37 and the second antenna coil 42 are omitted from the non-contact IC card 30.

The illustrated non-contact IC card 30B comprises the flexible board 32 having the principal surface 32a. The flexible board 32 has substantially a rectangular shape. The non-contact IC card 30B comprises the electronic circuit part 36 mounted on the principal surface 32a of the flexible board 32. The electronic circuit part 36 includes the IC chip (not shown). The electronic circuit part 36 has the first and the second terminals 361 and 362.

The non-contact IC card 30B further comprises the antenna coil 41 connected to the electronic circuit part 36. The antenna coil 41 is formed on the principal surface 32a of the flexible board 32 by a plating method. The antenna coil 41 has the outer end portion 41a and the inner end portion 41b. The outer end portion 41a of the antenna coil 41 is connected to the first terminal 361 of the electronic circuit part 36 through the first lead wire 461. The inner end portion 41b of the antenna coil 41 is connected to the extended end portion 41c through the second lead wire 462. The extended end portion 41c is connected to the second terminal 362 of the electronic circuit part 36.

In order to prevent electrical short between the second lead wire 462 and the antenna coil 41, the insulating film 48 is disposed on the antenna coil 41 at a position between the inner end portion 41b and the extended end portion 41c.

Figure 10:
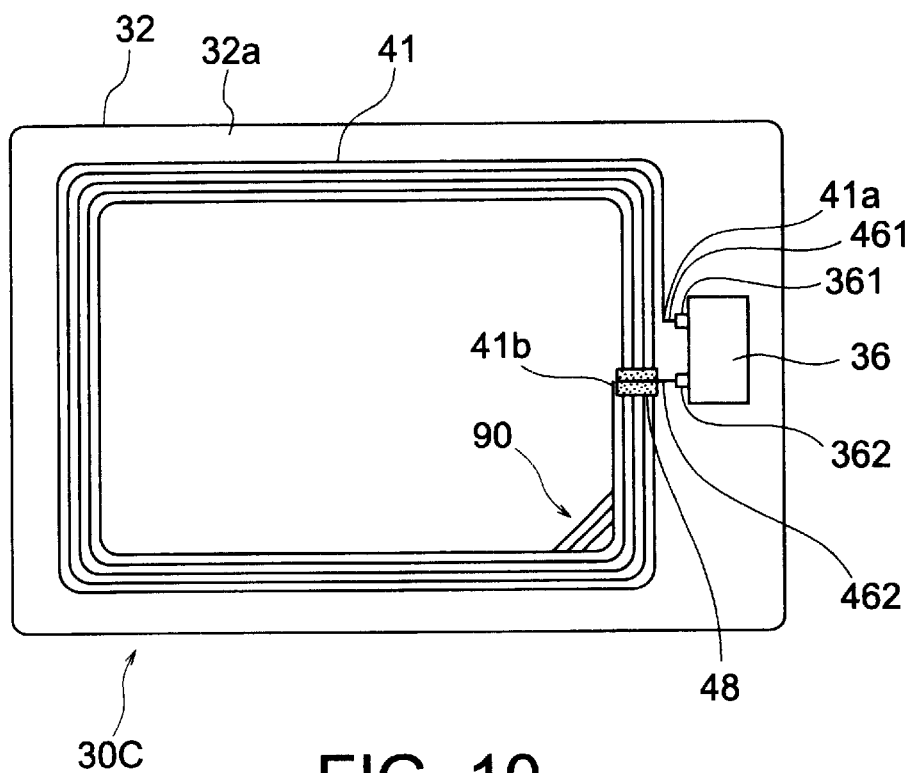
FIG. 10 is a plan view of a non-contact IC card according to a fourth embodiment of the present invention.
Figure 11:
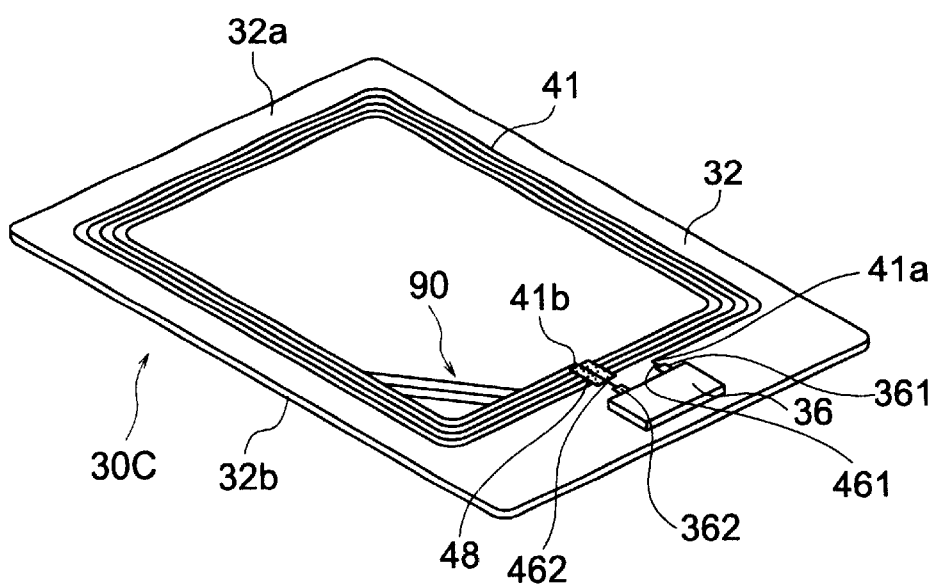
FIG. 11 is a perspective view of the non-contact IC card illustrated in FIG. 10.

Referring to FIGS. 10 and 11, description will proceed to a non-contact IC card 30C according to a fourth embodiment of the present invention. The illustrated non-contact IC card 30C is similar in structure and operation to the non-contact IC card 30B illustrated in FIG. 9 except that the antenna coil 41 further comprises an inductance adjustment circuit part 90 at the inside of at least one corner of the antenna coil 41.

Figure 12:
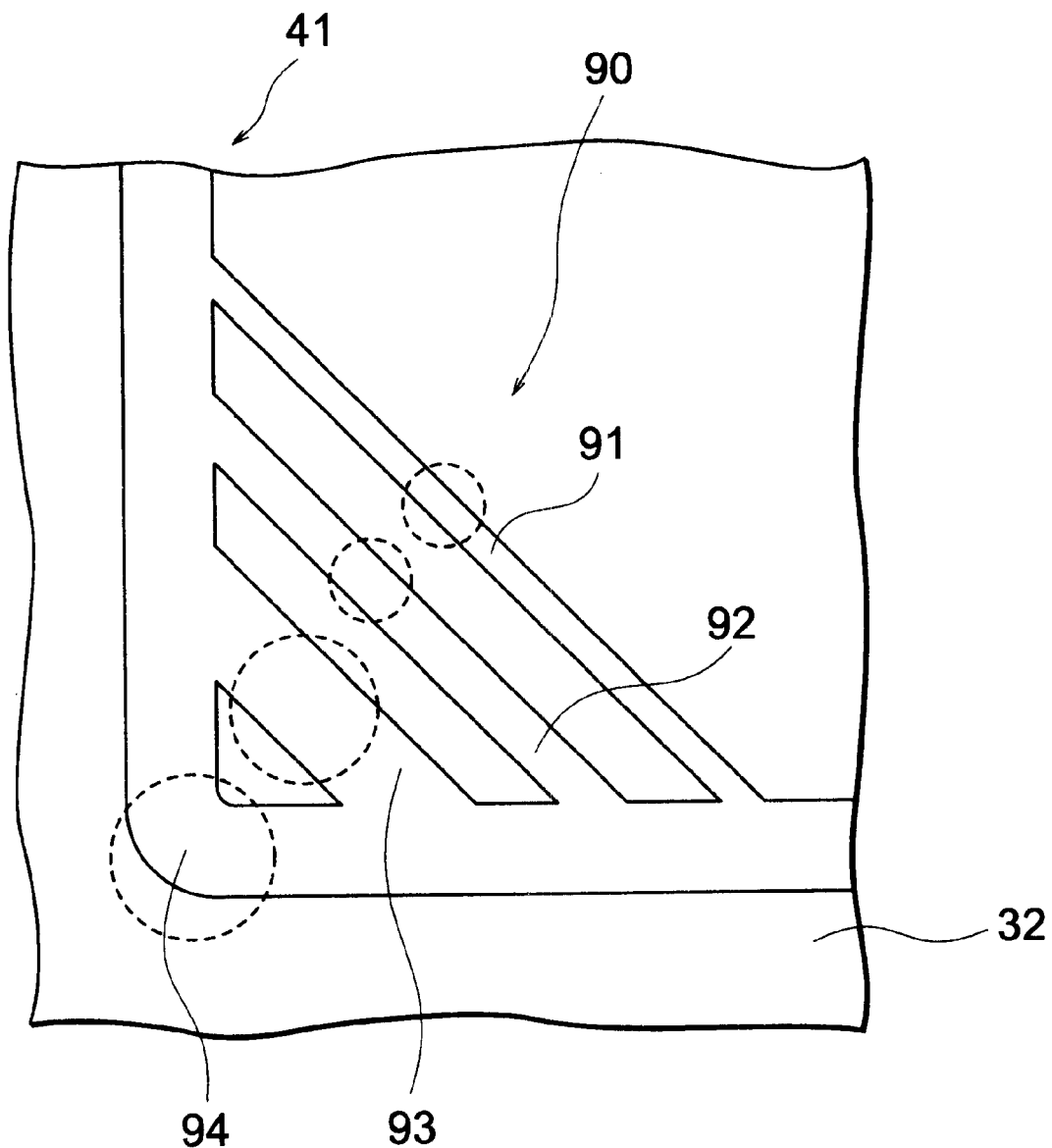
FIG. 12 is an enlarged view of an inductance adjustment circuit part in FIGS. 10 and 11.

Turning to FIG. 12, the inductance adjustment circuit part 90 comprises first through fourth wires 91, 92, 93, and 94 which have different lengths and different widths one another. In order to make the antenna coil 41 have a desired inductance, one of the first through the fourth wires 91 to 94 is conducted and three remaining wires are disconnected. Specifically, three punch holes are bored in three of four areas enclosed with broken lines by means of laser cutting, die cutting, or the like to disconnect the three remaining wires.

With this structure, it is possible to adjust inductance of the antenna coil 41 by selectively conduct one of the first through the fourth wires 91 to 94. That is, inasmuch as the first through the fourth wires 91 to 94 have the different length and the different widths, it is possible to make the inductance of the first antenna coil 41 have a desired value by suitably selecting one of the first through the fourth wires 91 to 94 to be conducted.

As described above, according to the above-mentioned non-contact IC card 30C, it is possible to adjust the inductance of the antenna coil 41 after forming the antenna coil 41 on the principal surface 32a of the flexible board 32. As a result, it is possible to make the non-contact IC card 30C operate in stable because the antenna coil 41 has the desired inductance.

In addition, although the antenna coil 41 has a dispersed pattern thickness, it is possible to restrain dispersion of the inductance of the antenna coil 41. Furthermore, the non-contact IC card 30C has superior productivity. although the dispersion of the inductance of the antenna coil 41 occurs.

Although the above-mentioned non-contact IC card 30C comprises the inductance adjustment circuit part 90 comprising the first through the fourth wires 91 to 94 which have different lengths and different widths one another, this invention is restricted to such structure. That is, the non-contact IC card may comprise an inductance adjustment circuit part comprising a plurality of wires which have different lengths or different widths. The inductance adjustment circuit part may comprise a plurality of wires which has the same width and different lengths.

Although the above-mentioned non-contact IC card 30C comprises the inductance adjustment circuit part 90 which is disposed at the inside of only one corner of the antenna coil 41, the inductance adjustment circuit part 90 may be disposed at the inside of two or more corners of the antenna coil 41.

Figure 13:
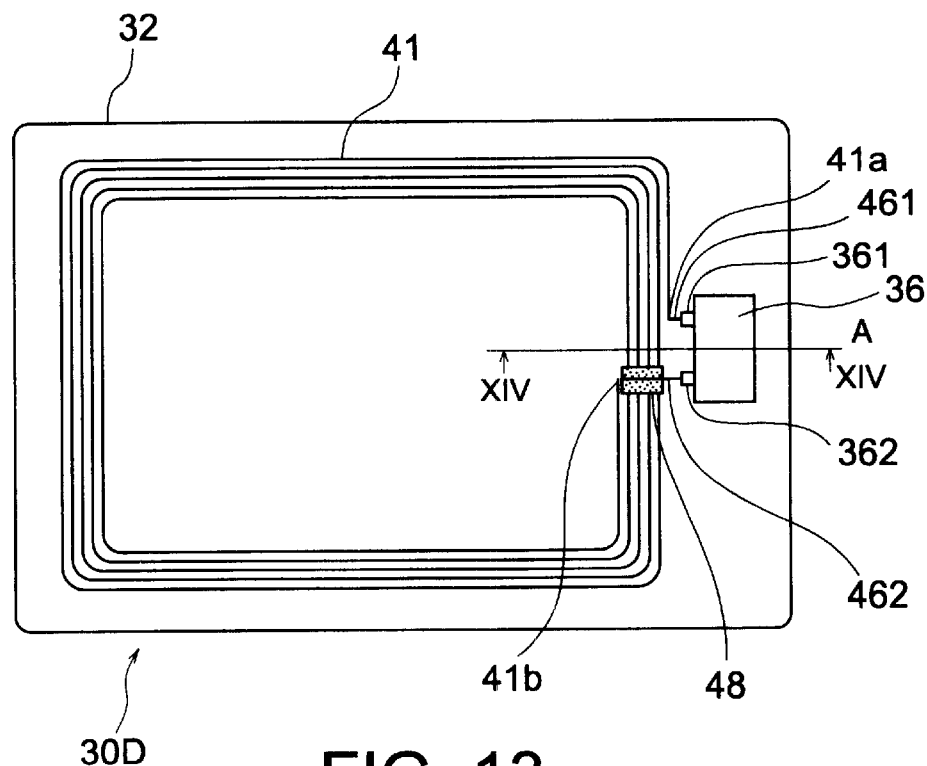
FIG. 13 is a plan view of a non-contact IC card according to a fifth embodiment the present invention.
Figure 14:
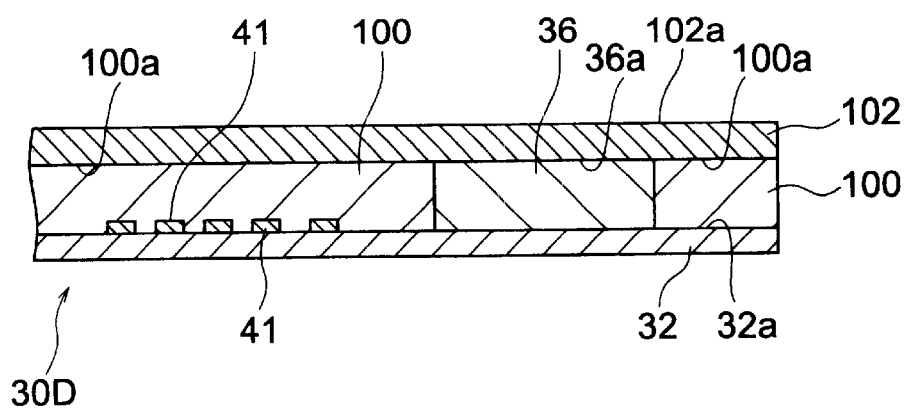
FIG. 14 is a sectional view taken substantially along on the line XIV—XIV of FIG. 13.

Referring to FIGS. 13 and 14, description will proceed to a non-contact IC card 30D according to a fifth embodiment of the present invention. The illustrated non-contact IC card 30D comprises the flexible board 32 having the principal surface 32a, the electronic circuit part 36 mounted on the principal surface 32a of the flexible board 32, and the antenna coil 41 formed on the principal surface 32a of the flexible board 32. The antenna coil 41 is electrically connected to the electronic circuit part 36.

As shown in FIG. 14, the non-contact IC card 30D further comprises an insulating layer 100 deposited on the principal surface 32a of the flexible board 32 at an area except for the electronic circuit part 36 so as to cover the antenna coil 41. In other words, the insulating layer 100 does not cover the electronic circuit part 36.

In addition, the non-contact IC card 30D further comprises a decorative laminated sheet or tape 102 formed on the insulating layer 100 and the electronic circuit part 36. The decorative laminated tape 102 plays roles to make the non-contact IC card 30D excellent as seen from the outside and to protect the electronic circuit part 36 from external dampness, an impact, and so on. For this purpose, the decorative laminated tape 102 is put on substantially the whole surface of the non-contact IC card 30D.

Now, the description will proceed to a fabrication process of the non-contact IC card 30D. First, the antenna coil 41 is formed on the principal surface 32a of the flexible board 32 by the above-mentioned plating method. The antenna coil 41 may be formed on the principal surface 32a of the flexible board 32 by the above-mentioned etching method.

Subsequently, the insulating layer 100 is deposited on the principal surface 32a of the flexible board 32 except for a part on which the electronic circuit part 36 should be mounted. Alternatively, an insulating material may be deposited on the principal surface 32a of the flexible board 32 so as to cover the whole surface of the principal surface 32a and thereafter an opening part is bored in the insulating material by means of etching or the like to the part of the insulating material on that the electronic circuit part 36 should be mounted.

Subsequently, the electronic circuit part 36 is mounted on the principal surface 32a of the flexible board 32 so as to electrically connect the electronic circuit part 36 with the antenna coil 41. As a result, the electronic circuit part 36 has a principal surface 36a having a height which substantially equal to that of a principal surface 100a of the insulating layer 100. In other words, the afore-mentioned insulating layer 100 preferably may be formed so as to have a thickness which is substantially equal to the height of the electronic circuit part 36 when the electronic circuit part 36 is mounted on the principal surface 32a of the flexible board 32.

Subsequently, the decorated laminated tape 102 is put to the principal surface 100a of the insulating layer 100 and the principal surface 36a of the electronic circuit part 36 so as to cover the insulating layer 100 and the electronic circuit part 36. If necessary, word such as print is performed on a principal surface 102a of the decorated laminated tape 102.

In the non-contact IC card 30D constructed in the above-mentioned manner, inasmuch as the insulating layer 100 is not formed on the electronic circuit part 36, the decorated laminated tape 102 has the principal surface 102a which is highly flat. In other words, the non-contact IC card 30D has no difference in level between a part where the electronic circuit part 36 is mounted and another part. Accordingly, it is possible for the non-contact IC card 30D to easily perform print on the principal surface 102a of the decorated laminated tape 102. In addition, this print is very beautiful externally because there in no difference in level on the principal surface 102a of the decorated laminated tape 102. Furthermore, it is possible for the non-contact IC card 30D to prevent occurrence of catching on an external projection or the like because there is no difference in level on the principal surface 102a of the decorated laminated tape 102. In the manner as described above, the non-contact IC card 30D is not only excellent outwardly but also excellent in mechanical strength.

Figure 15:
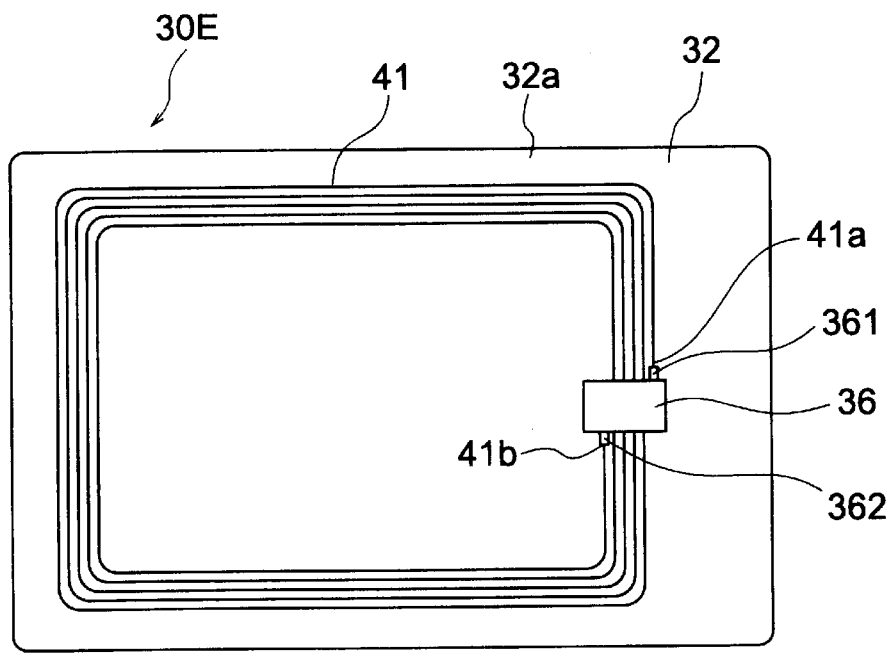
FIG. 15 is a plan view of a non-contact IC card according to a sixth embodiment the present invention.
Figure 16:
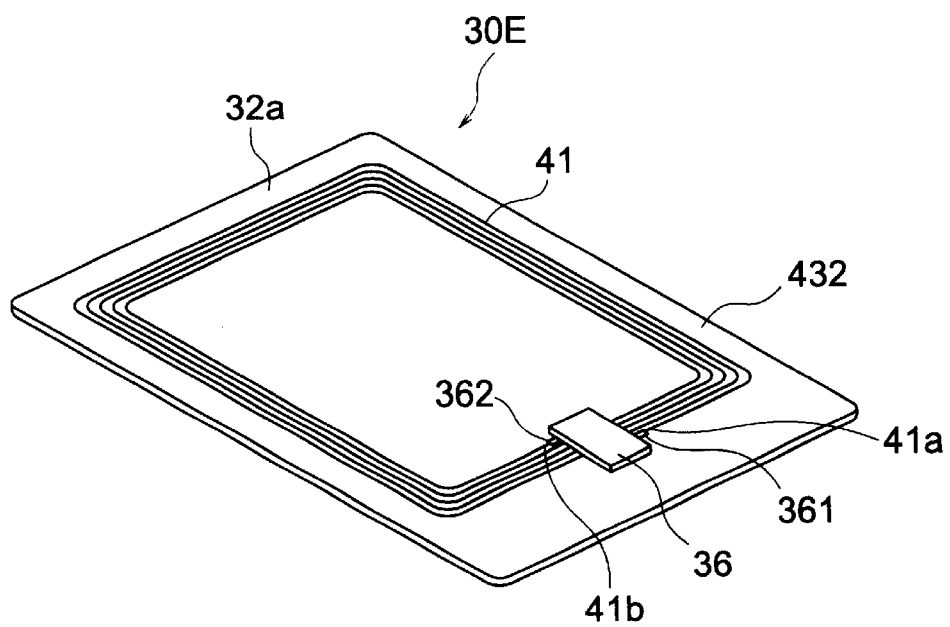
FIG. 16 is a perspective view of the non-contact IC card illustrated in FIG. 15.

Referring to FIGS. 15 and 16, description will proceed to a non-contact IC card 30E according to a sixth embodiment of the present invention. The illustrated non-contact IC card 30E is similar in structure and operation to the non-contact IC card 30B illustrated in FIG. 9 except that the electronic circuit part 36 is disposed so as to stride over the antenna coil 41 at a predetermined area.

The electronic circuit part 36 has the first and the second terminals 361 and 362. The antenna coil 41 is formed on the principal surface 32a of the flexible board 32 by, for example, the above-mentioned plating method. The antenna coil 41 may be formed on the principal surface 32a of the flexible board 32 by the above-mentioned etching method. The antenna coil 41 has the outer end portion 41a and the inner end portion 41b. The first terminal 361 of the electronic circuit part 36 is connected to the outer end portion 41a of the antenna coil 41 by soldering or the like. Likewise, the second terminal 362 of the electronic circuit part 36 is connected to the inner end portion 41b of the antenna coil 41 by soldering or the like.

In the above-mentioned non-contact IC card 30E, an insulating layer (not shown) may be inserted or put between the electronic circuit part 36 and the antenna coil 41. That is, the insulating layer may be deposited on the antenna coil 41 at the predetermined area before disposing the electronic circuit part 36 at the predetermined area and thereafter the electronic circuit part 36 may be disposed on the insulating layer. In this event, the antenna coil 41 and the electronic circuit part 36 are apart from each other by a distance corresponding to a thickness of the insulating layer. As a result, inasmuch as effect of a magnetic field or the like caused by a current flowing in the antenna coil 41 is decreased, the electronic circuit part 36 is not seriously affected by the magnetic field or the like. Accordingly, in this case, the non-contact IC card 30E can more certainly carry out reception and transmission of an electromagnetic field.

In the above-mentioned non-contact IC card 30E, in the manner which is described above, it is possible to very easily connect the antenna coil 41 with the electronic circuit part 36 after forming the antenna coil 41 in a predetermined shape. That is, it is unnecessary for the non-contact IC card 30E to form a lead wire so as to stride across the antenna coil 41 from the inner end portion 41b of the antenna coil 41. According to the above-mentioned process, it is therefore possible to easily connect the outer and the inner end portions 41a and 41b of the antenna coil 41 with the first and the second terminals 361 and 362 of the electronic circuit part 36, respectively. Accordingly, this process can fabricate the non-contact IC card 30E with good productivity.

Figure 17:
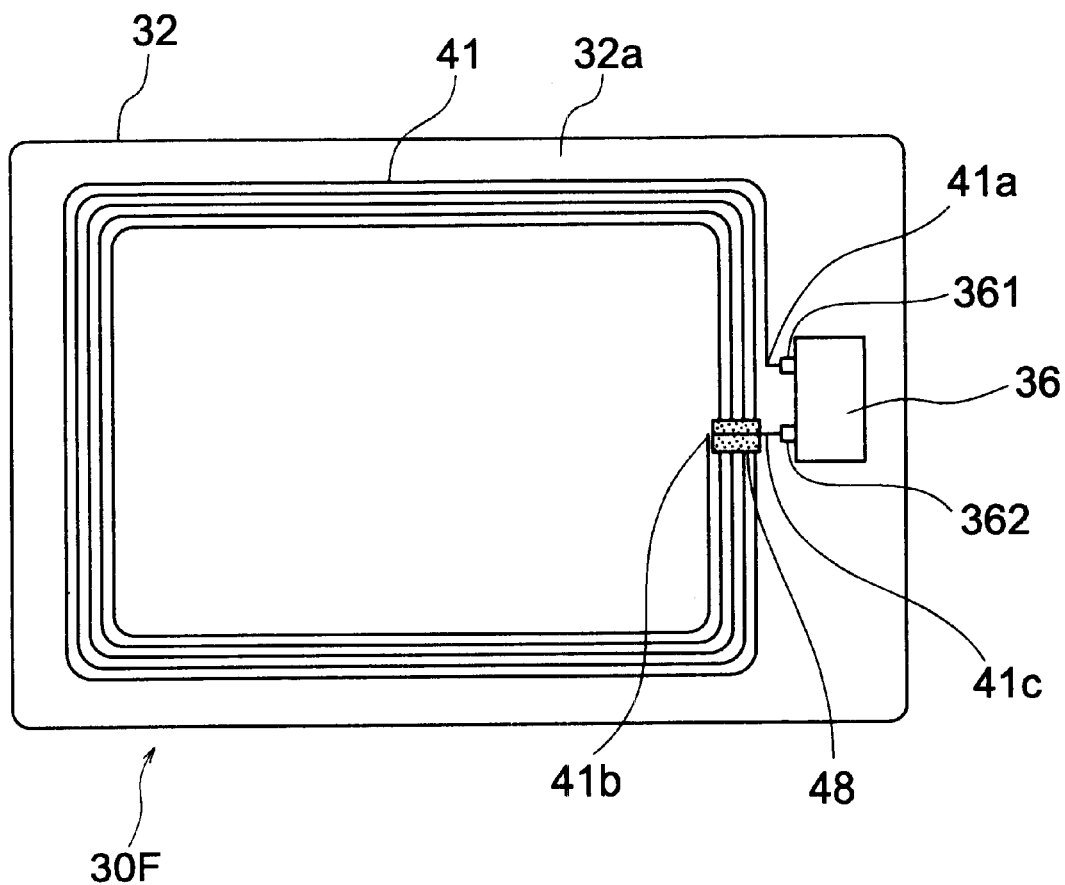
FIG. 17 is a plan view of a non-contact IC card according to a seventh embodiment of the present invention.
Figure 18:
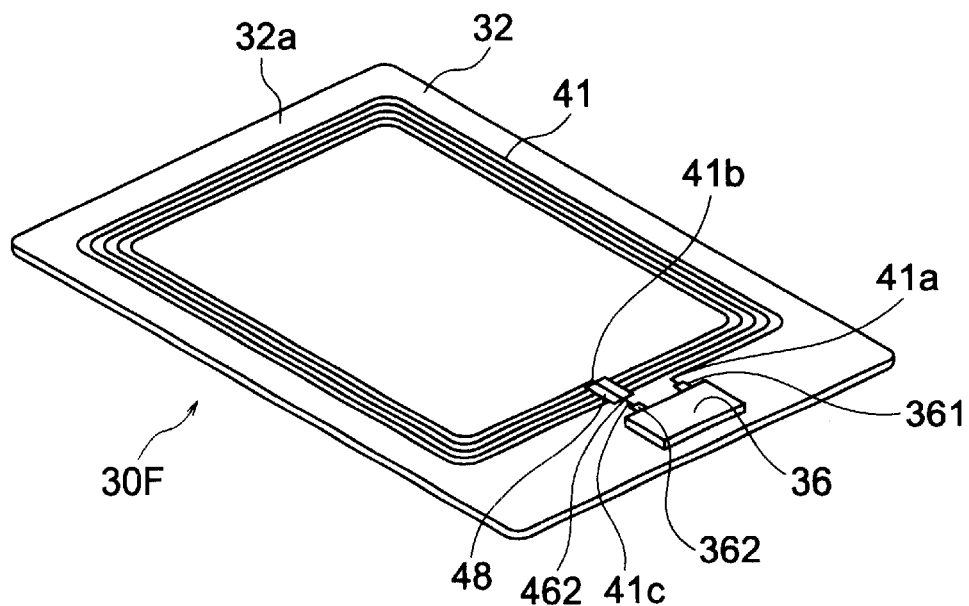
FIG. 18 is a perspective view of the non-contact IC card illustrated in FIG. 17.
Figure 19:
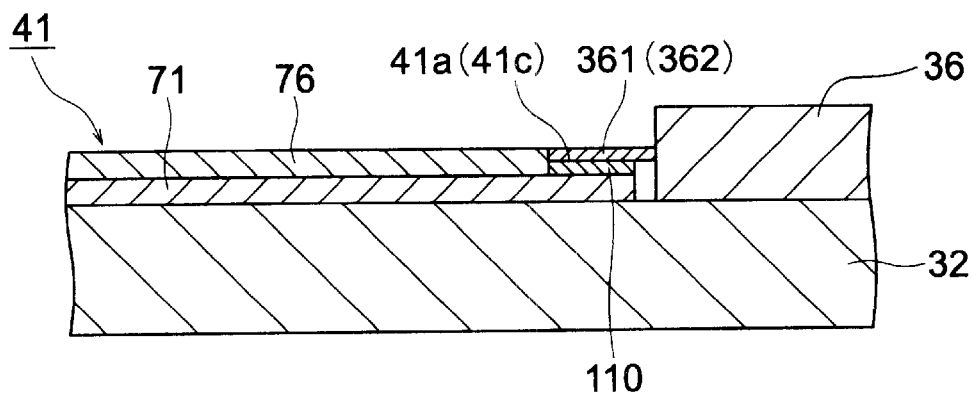
FIG. 19 is a fragmentary sectional view, on an enlarged scale, of a connection portion of a terminal seen in FIGS. 17 and 18.

Referring to FIGS. 17 through 19, description will proceed to a non-contact IC card 30F according to a seventh embodiment of the present invention. The illustrated non-contact IC card 30F is similar in structure and operation to the non-contact IC card 30B illustrated in FIG. 9 except for a connection method for electrically connecting the first and the second terminals 361 and 362 of the electronic circuit part 36 with the outer end portion 41a and the extended end portion 41c of the antenna coil 41 in the manner which will become clear as the description proceeds.

As shown in FIG. 19, in the illustrated non-contact IC card 30F, the antenna coil 41 comprises the conductive ground coat pattern 71 formed on the principal surface 32a of the flexible board 32 in a coil shape and the metallic plate film 76 formed on the conductive ground coat pattern 71 as an area except for the outer end portion 41a and the extended end portion 41c. That is, the conductive ground coat pattern 71 is exposed at the outer end portion 41a and the extended end portion 41c.

In addition, the electronic circuit part 36 is electrically connected to the antenna coil 41 by attaching the first and the second terminals 361 and 362 on the outer end portion 41a and the extended end portion 41c through conductive adhesives 110. That is, in the non-contact IC card 30F, the first and the second terminals 361 and 362 of the electronic circuit part 36 are electrically connected to the conductive ground coat pattern 71.

Figure 20A:
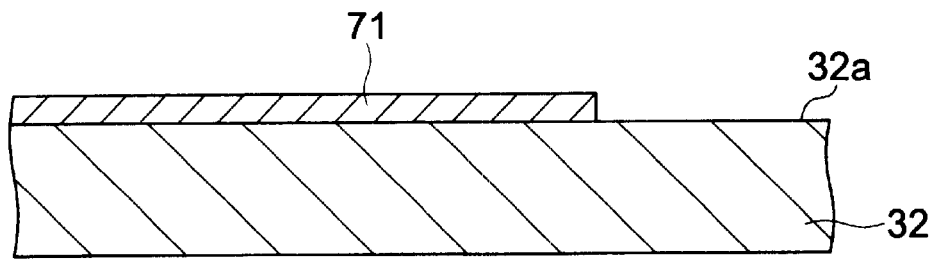
FIGS. 20A through 20C illustrate a fabrication process of the non-contact IC card illustrated in FIGS. 17 through 19.
Figure 20B:
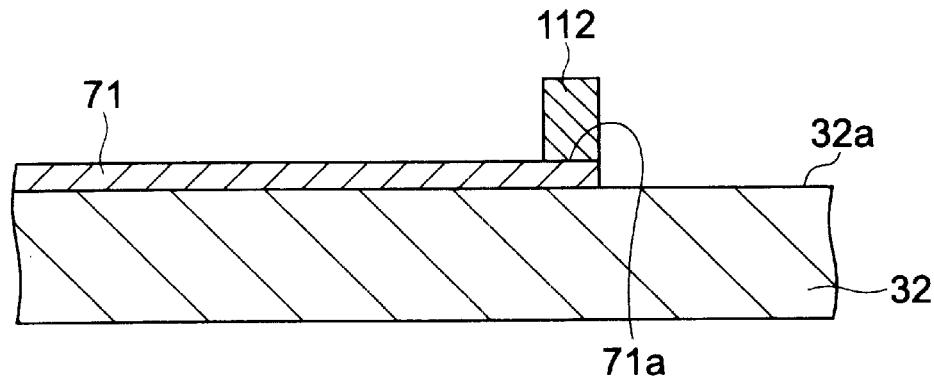
Figure 20C:
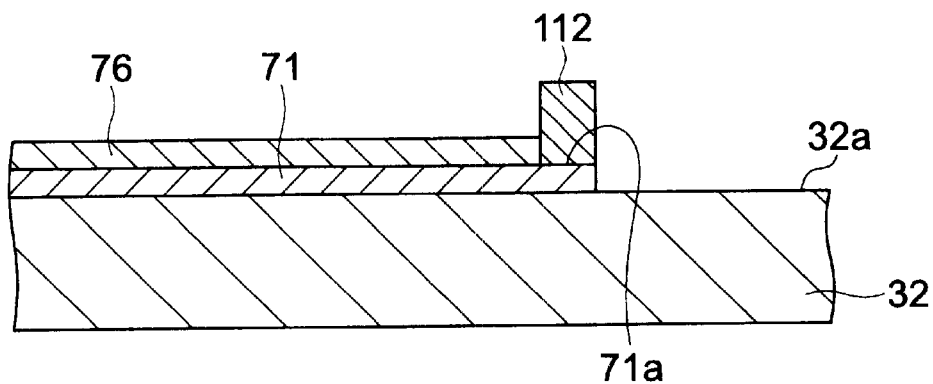
Figure 21:
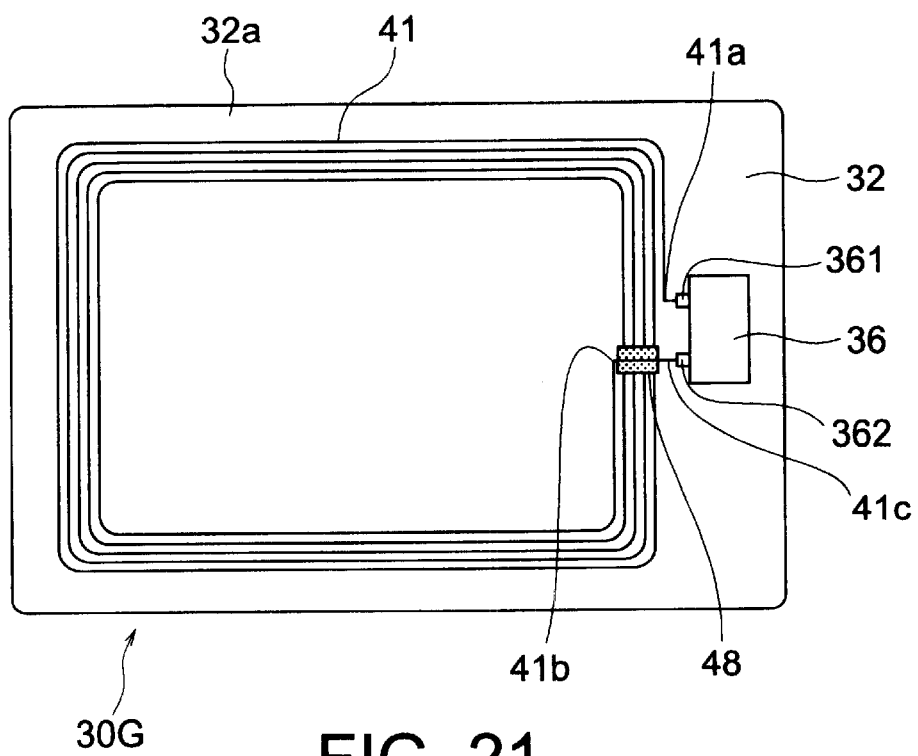
FIG. 21 is a plan view of a non-contact IC card according to an eighth embodiment of the present invention.
Figure 22:
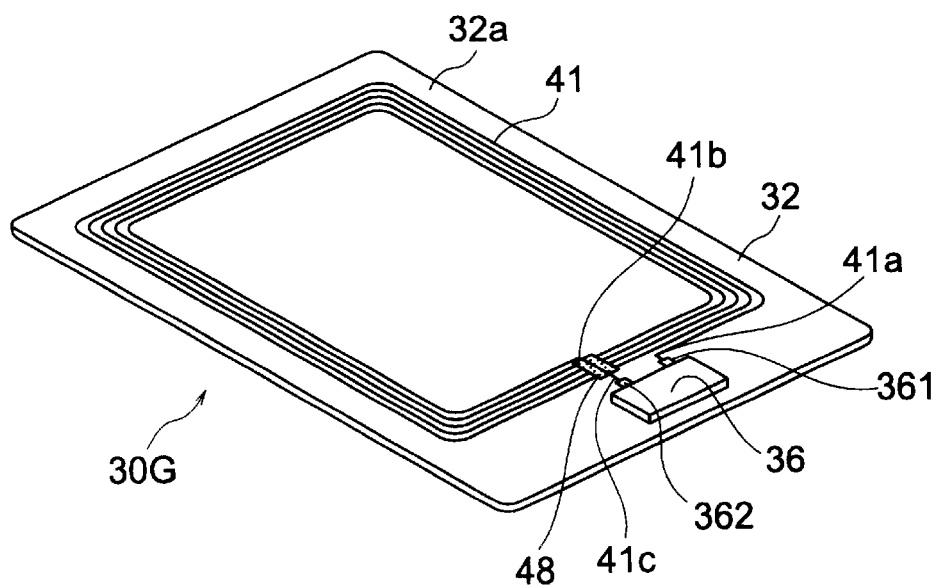
FIG. 22 is a perspective view of the non-contact IC card illustrated in FIG. 21.

Referring to FIGS. 20A, 20B, and 20C in addition to FIG. 19, description will proceed to a fabrication process of the non-contact IC card 30F illustrated in FIGS. 17 and 18.

As shown in FIG. 20A, the flexible board 32 is prepared in a known manner and has the principal surface 32a which is directed an upward of FIG. 20A. The conductive ground coat pattern 71 is formed on the principal surface 32a of the flexible board 32 so as to correspond to a shape of the antenna coil 41 (FIGS. 17 and 18) to be formed. The conductive ground coat pattern 71 is made of a conductive resin or the like and has the coil shape.

Turning to FIG. 20B, a pair of plating electric terminals 112 (only one plating electric terminal is illustrated in FIG. 20B) are disposed on both end parts 71a of the conductive ground coat pattern 71. One of the both end parts 71a corresponds to the outer end portion 41a (FIGS. 17 and 18) of the antenna coil 41 while another of the both end parts 71a corresponds to the inner end portion 41b (FIGS. 17 and 18) of the antenna coil 41. The pair of plating electric terminals 112 are connected to a power source (not shown) for supplying the conductive ground coat pattern 71 with a predetermined current.

Turning to FIG. 20C, by performing plate using the conductive ground coat pattern 71 to which the pair of plating electric terminals 112 are attached, the metallic plate film 76 is formed on the conductive ground coat pattern 71. Under the circumstances, inasmuch as the conductive ground coat pattern 71 has, as an external exposed area, an area except for the both end parts 71a or an area except for a portion where the pair of plating electric terminals 112 are disposed, almost all the external exposed area of the conductive ground coat pattern 71 is covered by the metallic plate film 76.

As a result, according to this method, the metallic plate film 76 is not formed near the both end parts 71a where the pair of plating electric terminals 112 are disposed. That is, according to this method, the metallic plate film 76 is formed on the conductive ground coat pattern 71 at a substantially whole area except for near the both end parts 71a of the conductive ground coat pattern 71.

Turning to FIG. 19, the pair of plating electric terminals 112 are removed from the conductive ground coat pattern 71 to make both end parts 71a of the conductive ground coat pattern 71 expose as both external exposed parts. One of the both external exposed parts 71a of the conductive ground coat pattern 71 is used as the outer end portion 41a of the antenna coil 41 while another of the both external exposed parts 71a of the conductive ground coat pattern 71 is used as the inner end portion 41b (FIGS. 17 and 18) of the antenna coil 41. The inner end portion 41b of antenna coil 41 is electrically connected via the second lead wire 462 to an external exposed part 71a of the conductive ground coat pattern 71 that is used as the extended end portion 41c of the antenna coil 41. The electronic circuit part 36 is mounted on the principal surface 32a of the flexible board 32 so that the first and the second terminals 361 and 362 of the electronic circuit part 36 are put on the external exposed parts 71a (41a and 41c) of the conductive ground coat pattern 71. In this event, the first and the second terminals 361 and 362 of the electronic circuit part 36 are electrically connected to the external exposed parts 71a (41a and 41c) of the conductive ground coat pattern 71 through the conductive adhesives 110. Accordingly, as shown in FIG. 19, the first and the second terminals 361 and 362 of the electronic circuit part 36 are electrically connected to the outer end portion 41 a and the extended end portion 41c of the antenna coil 41.

In the manner which is described above, in the non-contact IC card 30F, the first and the second terminals 361 and 362 of the electronic circuit part 36 are electrically connected to the conductive ground coat pattern 71 through the conductive adhesives 110. Inasmuch as the conductive ground coat pattern 71 is made of, for example, the conductive resin or the like, the conductive adhesives 110 for adhering the first and the second terminals 361 and 362 of the electronic circuit part 36 effectively act. It is therefore possible to certainly adhere the first and the second terminals 361 and 362 of the electronic circuit part 36 to the outer and portion 41a and the extended end portion 41c of the antenna coil 41. In addition, it is possible for the non-contact IC card 30F to decrease a resistance value between the electronic circuit part 36 and the antenna coil 41 and to make the non-contact IC card 30F operate at a low voltage.

In addition, inasmuch as the first and the second terminals 361 and 362 of the electronic circuit part 36 are put on the conductive ground coat pattern 71 in the non-contact IC card 30F, it is possible to set the antenna coil 41 and the first and the second terminals 361 and 362 of the electronic circuit part 36 so as to have substantially equal height. In other words, as shown in FIG. 19, it is possible for the non-contact IC card 30F to position the first and the second terminals 361 and 362 of the electronic circuit part 36 and the metallic plate film 76 so as to have substantially same height. As a result, it is possible for the non-contact IC card 30F to prevent the first and the second terminals 361 and 362 of the electronic circuit part 36 from peeling off the conductive ground coat pattern 71 caused by an unexpected shock or the like. That is, the non-contact IC card 30F has mechanically superior strength.

Referring to FIGS. 21, 22, 23A, and 23B, description will proceed to a non-contact IC card 30G according to an eighth embodiment of the present invention. The illustrated non-contact IC card 30G is similar in structure and operation to the non-contact IC card 30F illustrated in FIGS. 17 through 19 except for a connection method for electrically connecting the first and the second terminals 361 and 362 of the electronic circuit part 36 with the outer end portion 41a and the extended end portion 41c of the antenna coil 41 in the manner which will become clear as the description proceeds. For the purpose of simplification of description, similar parts are attached with the same reference symbols and description thereof is omitted.

In the non-contact IC card 30G, the antenna coil 41 is formed by a plating method in the manner which will presently be described.

Figure 23A:
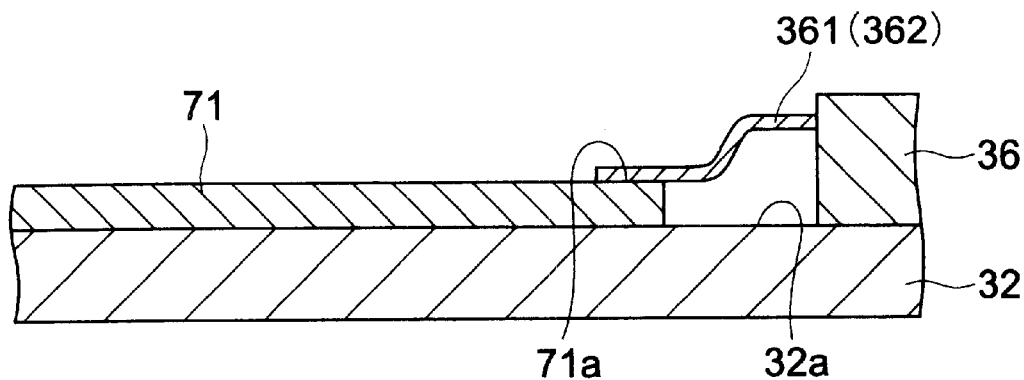
FIGS. 23A and 23B illustrate a fabrication process of the non-contact IC card illustrated in FIGS. 21 and 22.

As shown in FIG. 23A, the ground coat pattern 71 is formed on the principal surface 32a of the flexible board 32 in a predetermined shape. The conductive ground coat pattern 71 is obtained by printing a conductive paste in the predetermined shape. The conductive ground coat pattern 71 has the both end parts 71a which correspond to the outer end portion 41a and the extended end portion 41c of the antenna coil 41. The first and the second terminals 361 and 362 of the electronic circuit part 36 are put on the both end parts 71a of the conductive ground coat pattern 71. In other words, on performing plate, the first and the second terminals 361 and 362 of the electronic circuit part 36 are connected to the conductive ground coat pattern 71.

In this event, the electronic circuit part 36 may preferably be fixed on the principal surface 32a of the flexible board 32 by an adhesive (not shown) so that the base of the electronic circuit part 36 is surely adhered to the flexible board 32. As a result, it is possible to certainly prevent the electronic circuit part 36 from breaking away from the flexible board 32 before performing the plate. In addition, after performing the plate, it is also possible to strengthen an adhesion state between the flexible board 32 and the electronic circuit part 36 by adhering the electronic circuit part 36 via the adhesive.

Figure 23B:
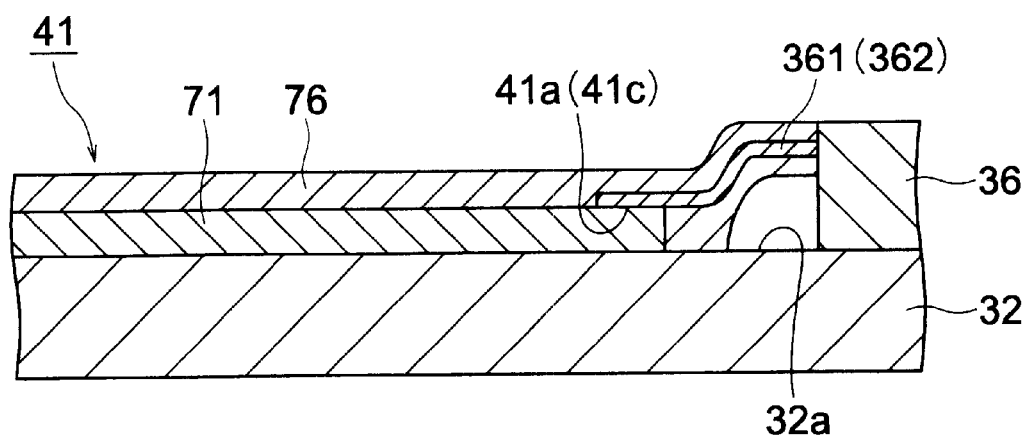

Turning to FIG. 23B, by performing the plate using the conductive ground coat pattern 71, the metallic plate film 76 is formed as shown in FIG. 23B. Under the circumstances, the plate is performed by supplying a predetermined current to the conductive ground coat pattern 71 and the first and the second terminals 361 and 362 of the electronic circuit part 36. As a result, according to this plate, the metallic plate film 76 is formed so as to cover the conductive ground coat pattern 71 and the first and the second terminals 361 and 362 of the electronic circuit part 36.

Accordingly, it is possible to certainly mount the electronic circuit part 36 on the principal surface 32a of the flexible board 32 at the same time when the antenna coil 41 is formed. That is, according to this method, it is possible to electrically connect the first and the second terminals 361 and 362 of the electronic circuit part 36 with the outer end portion 41a and the extended end portion 41c of the antenna coil 41 by forming the antenna coil 41 by the plating method.

According to this method, it is therefore to omit a step for mounting the electronic circuit part 36 after forming the antenna coil 41. As a result, it is possible to easily fabricate the non-contact IC card 30G. Specifically, in a case where the electronic circuit part 36 is mounted after the antenna coil 41 is formed, it is necessary to use a material such as a conductive adhesive, solder, an anisotropic conductive film, or the like in order to electrically connect the first and the second terminals 361 and 362 of the electronic circuit part 36 with the outer end portion 41a and the extended end portion 41c of the antenna coil 41. In contrast with this, according to this method, it is possible to certainly electrically connect the first and the second terminals 361 and 362 of the electronic circuit part 36 with the outer end portion 41a and the extended end portion 41c of the antenna coil 41 without using such a material. Accordingly, this method can decrease the number of parts and has excellent productivity.

In addition, in the non-contact IC card 30G, an insulating resin layer (not shown) may be formed so as to cover the metallic plate film 76. By covering the metallic plate film 76 with the insulating resin layer, it is possible to improve strength of a part for covering the first through the second terminals 361 and 362 of the electronic circuit part 36. As a result, it is possible to prevent the vicinity of the first and the second terminals 361 and 362 from breaking down caused by an unexpected shock or the like. Accordingly, it is possible to improve reliability of the non-contact IC card 30F.

Figure 24:
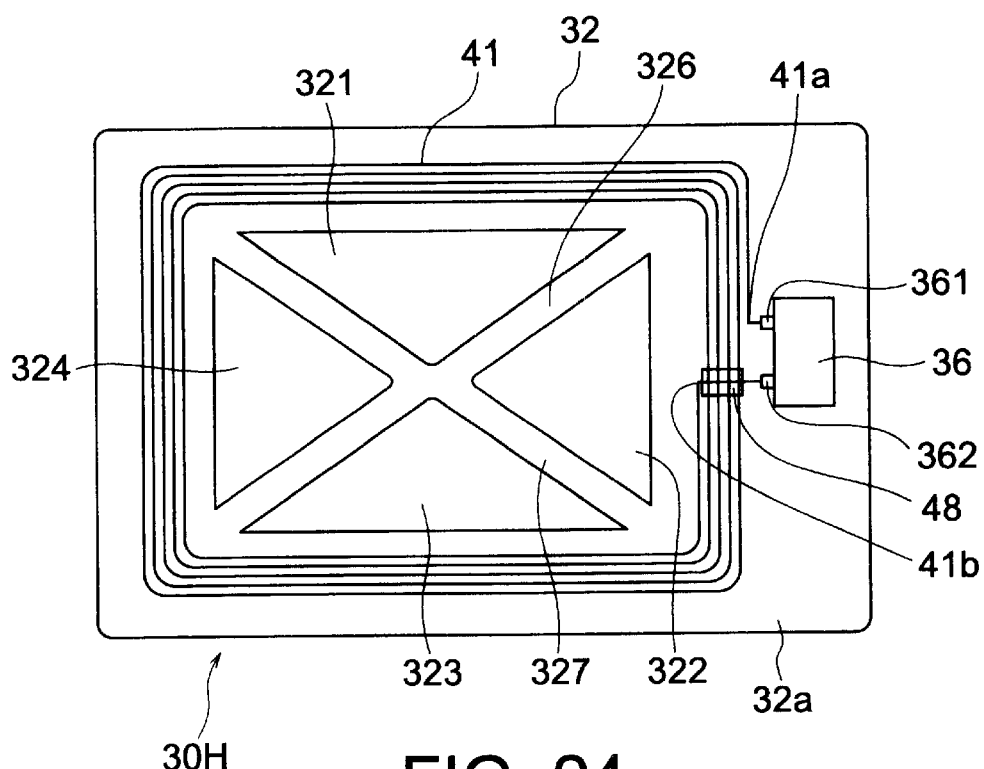
FIG. 24 is a plan view of a non-contact IC card according to a ninth embodiment of the present invention.
Figure 25:
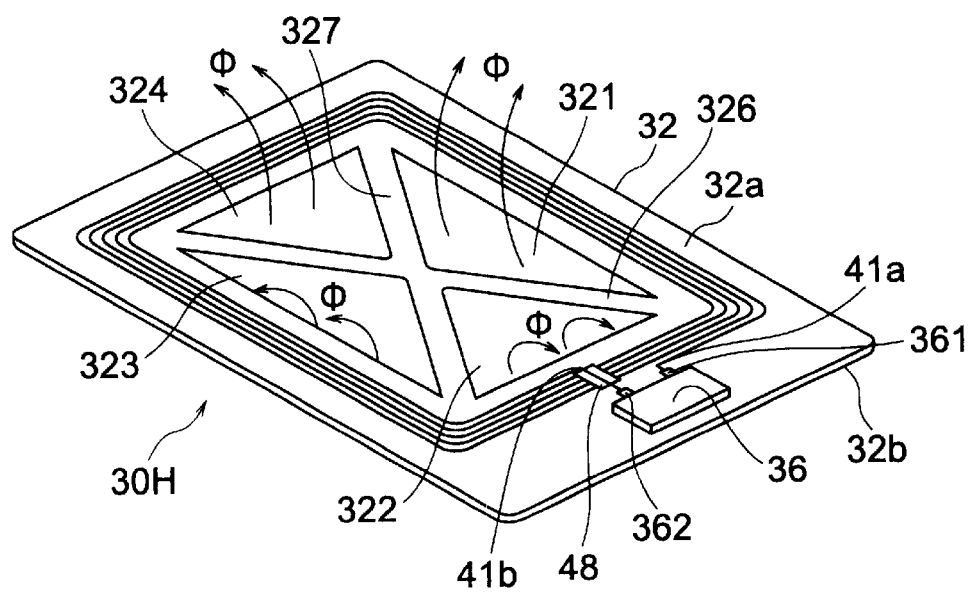
FIG. 25 is a perspective view of the non-contact IC card illustrated in FIG. 24.

Referring to FIGS. 24 and 25, description will proceed to a non-contact IC card 30H according to a ninth embodiment of the present invention. The illustrated non-contact IC card 30H is similar in structure and operation to the non-contact IC card 30B illustrated in FIG. 9 except that the non-contact IC card 30H has first through fourth opening sections 321, 322, 323, and 324 at a region enclosed with the antenna coil 41. For the purpose of simplification of description, similar parts are attached with the same reference symbols and description thereof is omitted.

The first through the fourth opening sections 321 to 324 are bored in the flexible board 32 and are apart from one another. Specifically, the non-contact IC card 30H comprises first and second beams 326 and 327 which extend diagonally in the region enclosed with the antenna coil 41. An opening section is partitioned into the first through the fourth opening sections 321 to 324 by the first and the second beams 326 and 327.

With this structure, the non-contact IC card 30H has improved magnetic permeability at the region enclosed with the antenna coil 41. This is because the non-contact IC card 30H has the first through the fourth opening sections 321 to 324 in the region enclosed with the antenna coil 41. That is, it is possible for the non-contact IC card 30H to achieve an increase of a magnetic flux depicted at Φ in FIG. 25 because of the improved magnetic permeability compared with a case where there is the flexible board 32 in the region enclosed with the antenna coil 41. Accordingly, the non-contact IC card 30H can make the antenna coil 41 flow much current caused by the improved magnetic permeability.

Although the non-contact IC card 30H has the first through the fourth opening sections 321 to 324 bored in the flexible board 32 in the above-mentioned embodiment, the non-contact IC card 30H may have at least one opening section bored in the flexible board 32.

Figure 26:
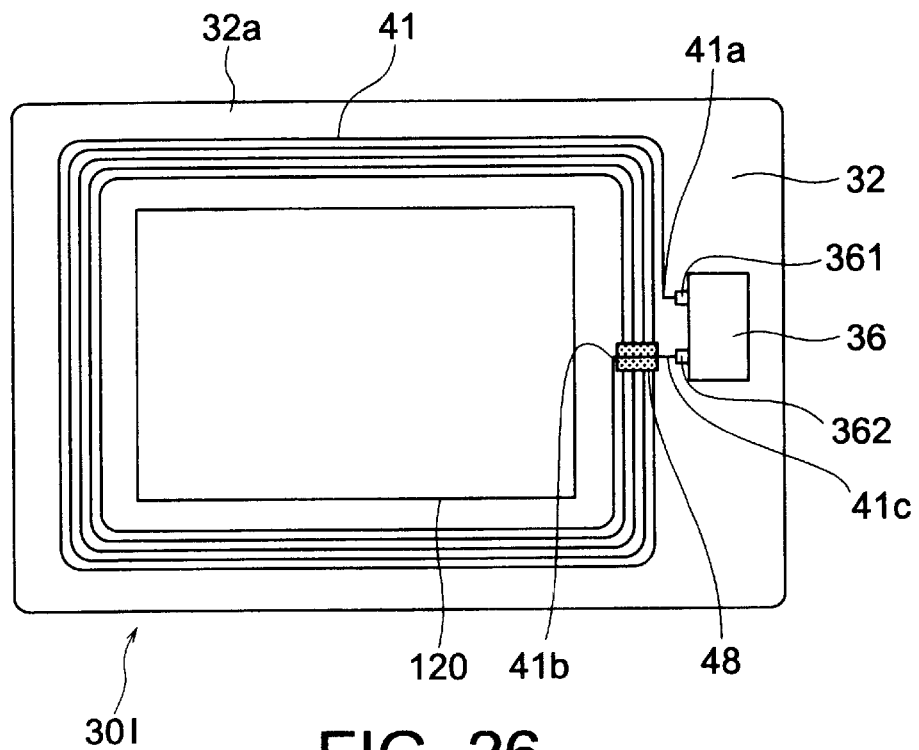
FIG. 26 is a plan view of a non-contact IC card according to a tenth embodiment of the present invention.
Figure 27:
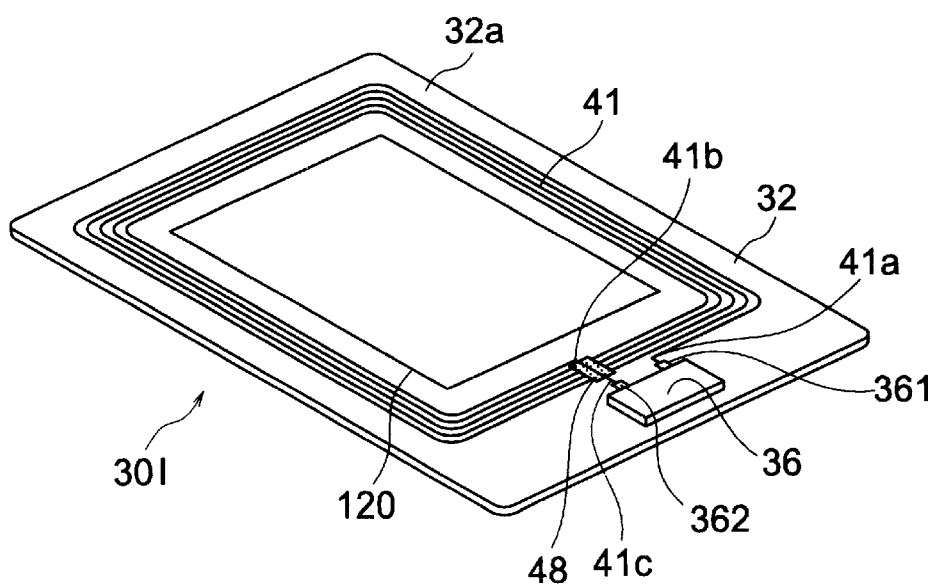
FIG. 27 is a perspective view of the non-contact IC card illustrated in FIG. 26.

Referring to FIGS. 26 and 27, description will proceed to a non-contact IC card 30I according to a tenth embodiment of the present invention. The illustrated non-contact IC card 30I is similar in structure and operation to the non-contact IC card 30B illustrated in FIG. 9 except that the non-contact IC card 30I comprises a magnetic material 120 disposed in a region enclosed with the antenna coil 41. For the purpose of simplification of description, similar parts are attached with the same reference symbols and description thereof is omitted.

With this structure, the non-contact IC card 30I has improved magnetic permeability at the region enclosed with the antenna coil 41. This is because the non-contact IC card 30I comprises the magnetic material 120 disposed in the region enclosed with the antenna coil 41. That is, it is possible for the non-contact IC card 30H to achieve an increase of a magnetic flux because of the improved magnetic permeability compared with a case where there is the flexible board 32 in the region enclosed with the antenna coil 41. Accordingly, the non-contact IC card 30I can make the antenna coil 41 flow much current caused by the improved magnetic permeability.

While this invention has thus far been described in conjunction with preferred embodiments thereof, it will now be readily possible for those skilled in the art to put this invention into various other manners.

What is claimed is:

1. A non-contact integrated circuit (IC) card comprising:
   a flexible board having a principal surface;
   an antenna coil on said principal surface of said flexible board, said electronic circuit part including at least one IC chip; and
   an antenna coil electrically connected to said electronic circuit part, formed on said principal surface of said flexible board, said antenna coil comprising an inductance adjustment circuit part,
   wherein said inductance adjustment circuit part is disposed at the inside of at least one corner of said antenna coil, and
   wherein said inductance adjustment circuit part comprises a plurality of wires which have different lengths, one of the wires being conducted while remaining wires are disconnected.

2. A non-contact IC card as claimed in claim 1, wherein said remaining wires are disconnected by forming punch holes.

3. A non-contact IC card as claimed in claim 2, wherein said punch holes are formed by means of laser cutting.

4. A non-contact IC card as claimed in claim 2, wherein said punch holes are formed by means of die cutting.

5. A non-contact IC card as claimed in claim 1, wherein said plurality of wires have different widths.

6. A method of adjusting inductance in an antenna coil formed on a principal surface of a flexible board for use in a non-contact integrated circuit (IC) card which comprises an electronic circuit part electrically connected to said antenna coil, said electronic circuit part including an IC chip, said method comprising the steps of:
   forming an inductance adjustment circuit part on said principal surface of said flexible board at the inside of at least one corner of said antenna coil, said inductance adjustment circuit part comprising a plurality of wires which have different lengths; and
   disconnecting said wires except for one of said wires with said one of the wires being conducted.

7. A method as claimed in claim 6, wherein the step of disconnecting said wires is performed by forming punch holes.

8. A method as claimed in claim 7, wherein said punch holes are formed by means of laser cutting.

9. A method as claimed in claim 7, wherein said punch holes are formed by means of die cutting.

10. A method as claimed in claim 6, wherein said plurality of wires have different widths.

11. A method of fabricating a non-contact integrated circuit (IC) card, said method comprising the steps of:
   preparing a flexible board having a principal surface;
   forming a conductive ground coat pattern on said principal surface of said flexible board in a coil shape, said conductive ground coat pattern having both end parts;
   disposing a pair of plating electric terminals on the both end parts of said conductive ground coat pattern;
   performing plate by supplying said conductive ground coat pattern with a predetermined current using the pair of plating electric terminals to form a plate film so as to cover said conductive ground coat pattern;
   removing said pair of plating electric terminals from said conductive ground coat pattern;
   mounting an electronic circuit part having first and second terminals on said principal surface of said flexible board so that the first and the second terminals of said electronic circuit part are put on the both end parts of said conductive ground coat pattern; and
   electrically connecting the first and the second terminals of said electronic circuit part with the both end parts of said conductive ground coat pattern through conductive adhesives.

12. A non-contact integrated circuit (IC) card comprising:
   a flexible board having a principal surface;
   an antenna coil formed on said principal surface of said flexible board; and
   an electronic circuit part electrically connected to said antenna coil, mounted on said principal surface of said flexible board, said electronic circuit part including at least one IC chip,
   said flexible board having an opening section in a region enclosed with said antenna coil,
   wherein said flexible board comprises at least one beam which extends diagonally in the region enclosed with said antenna coil, said opening section being partitioned into a plurality of small opening sections by said beam.

* * * * *